(12) United States Patent
Yedidia et al.

(10) Patent No.: US 8,499,218 B2
(45) Date of Patent: Jul. 30, 2013

(54) SYSTEM AND METHOD FOR DETERMINING QUASI-CYCLIC LOW-DENSITY PARITY-CHECK CODES HAVING HIGH GIRTH

(75) Inventors: Jonathan Yedidia, Cambridge, MA (US); Stark Draper, Madison, WI (US); Yige Wang, Shrewsbury, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 118 days.

(21) Appl. No.: 13/251,143

(22) Filed: Sep. 30, 2011

(65) Prior Publication Data

US 2013/0086456 A1     Apr. 4, 2013

(51) Int. Cl.
*H03M 13/00*     (2006.01)

(52) U.S. Cl.
USPC ............................ 714/758; 714/752; 714/755

(58) Field of Classification Search
USPC ......................................... 714/752, 755, 758
See application file for complete search history.

(56) References Cited

PUBLICATIONS

Wang et al. Hierarchical and High Girth QC LDPC Codes, Sep. 2008, 5th Syymp. Turbo Coding and Related Topics, Lausanne Switzerland, pp. 1-29.*
Chien et al. A high throughput H-QC LDPC Decoder, 2007, IEEE Transaction on information theory, pp. 1649-1652.*
Wang et al. Construction of High-Girth QC-LDPC codes, Sep. 2008, Proc. 5th Int. Symp.Turbo coding, pp. 180-185.*

* cited by examiner

*Primary Examiner* — Sam Rizk
(74) *Attorney, Agent, or Firm* — Dirk Brinkman; Gene Vinokur

(57) ABSTRACT

A method estimates parameters of 3-phase voltage signals to synchronize a power grid in a presence of a voltage unbalance by transforming the 3-phase voltage signals to $\alpha\beta$-reference signals using a Clarke transformation matrix, and estimating sinusoidal signals and corresponding quadrature signals of the $\alpha\beta$-reference signals using an extended Kalman filter, and determining a phase angle of a positive sequence based on a relationship of the phase angle to the estimated the sinusoidal signals.

19 Claims, 12 Drawing Sheets

100

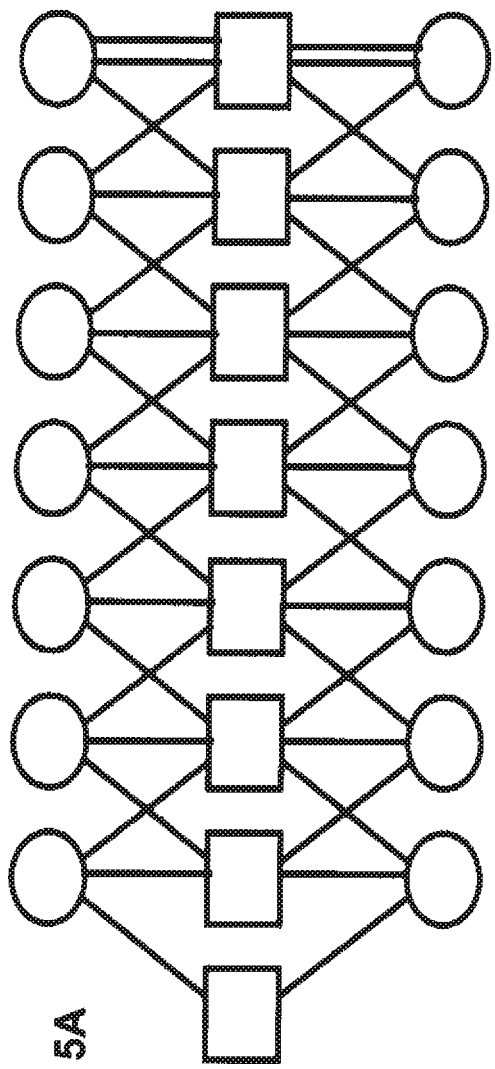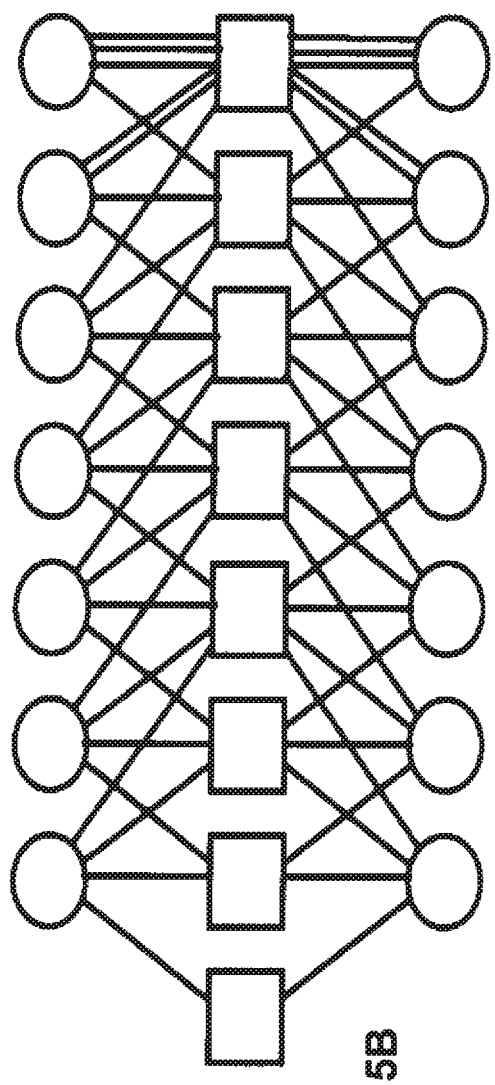
Fig. 5A
Fig. 5B

600

1100

SYSTEM AND METHOD FOR DETERMINING QUASI-CYCLIC LOW-DENSITY PARITY-CHECK CODES HAVING HIGH GIRTH

FIELD OF THE INVENTION

This invention relates generally to quasi-cyclic (QC) low-density parity-check (LDPC) codes, and more particularly to determining the QC LDPC codes having high girth.

BACKGROUND OF THE INVENTION

Two broad classes of methods can be used for the construction of low-density parity-check (LDPC) codes. One set is based on highly random graph constructions, while the other is based on structured algebraic constructions. Random graph constructions can produce LDPC codes that approach the Shannon capacity.

LDPC graph constructions normally use a "Tanner graph," which is a bi-partite graph including "variable" nodes representing the codeword bits, and "check" nodes representing the parity checks, where a variable node is connected to a check node by an edge if and only if the corresponding entry in the parity check matrix for the code is nonzero. Tanner graphs are well known.

Although codes based on highly random Tanner graph construction can closely approach the Shannon limit, these constructions are not easy to implement in hardware because the irregular connections between check and variable nodes in the Tanner graph of the code imply high wiring complexity. In actual implementations, more structured constructions are preferred because those provide much more practical wiring, and more straightforward parallelism in the decoders.

Quasi-cyclic LDPC (QC LDPC) codes are structured graphs that use a parity check matrix. The parity check matrix is partitioned into sub-matrices that have a circulant structure. Because the structured graph is practical to implement in hardware, QC LDPC codes are used in a variety communication networks, such as those implemented according to the IEEE 802.16e, DVB-S2, and IEEE 802.11 standards.

For most applications, it is important to optimize decoding performance in a "water-fall" regime where the signal-to-noise ratio (SNR) is relatively low.

However, for some applications, optimizing water-fall performance is not sufficient. One must also avoid "error floors" that are inherent in many LDPC codes in the higher SNR regimes. An "error floor" in the performance curve means that the decoding failure rate does not continue to decrease rapidly as the SNR increases. Eliminating or lowering the error floors is particularly important for applications that require extreme reliability demands, including high density magnetic recording and high speed fiber-optic communication systems.

Generally, QC LDPC codes are constructed based on a wide variety of techniques, including finite geometries, finite fields, and combinatorial designs. Recently, there has also been great interest in a class of "convolutional," or "spatially-coupled" codes, which are much more structured than the conventional random constructions, but have also been shown to closely approach the Shannon capacity, or even to achieve the Shannon capacity on a binary erasure channel (BEC). Those codes are significant here, because those codes can be implemented using quasi-cyclic constructions, and should thus be able to achieve very good performance while retaining the practicality of other structured QC LDPC codes.

Error floor issues for LDPC codes that are decoded using belief propagation (BP) decoders are generally caused by "trapping sets." A trapping set is a set of a small number of bits that reinforce each other in their incorrect beliefs. Trapping sets of bits are invariably arranged in clustered short cycles in the Tanner graph for the code. One way to remove the trapping sets is to design the Tanner graph so that clusters of short cycles do not exist. An alternative, and at least conceptually simpler approach is to design codes with larger girths. The "girth" of a code is defined as a length of the shortest cycle in the Tanner graph. Removing short cycles may eliminate potentially dangerous configurations of cycles, and hopefully lower the error floor.

Codes with good water-fall performance inevitably have some irregularity in the degree-distributions of the factor or variable nodes of the code graph. For the case of QC LDPC codes, these irregular distributions are most easily described in terms of "protographs," which are variants of Tanner graphs where bits and checks of the same type are represented by a single "proto-bit" or "proto-check." Protographs are a well-known way to describe families of codes.

In the case of QC LDPC codes, proto-bits can, for example, represent bits belonging to the same circulant sub-matrices. The protographs that arise in codes that have been optimized for waterfall performance typically have some pairs of proto-bits and proto-checks that are connected by multiple edges. A straightforward way to construct QC LDPC codes that correspond to such protographs use QC LDPC codes where the circulant sub-matrices have rows and columns of weight greater than one. Unfortunately, those QC LDPC codes inevitably have short cycles in their Tanner graphs.

Accordingly, there is a need to provide a method for determining a QC LDPC code corresponding to a protograph, such that the QC LDPC code has a predetermined relatively high girth, even when the protograph has pairs of proto-bits and proto-checks that are connected by multiple edges.

SUMMARY OF THE INVENTION

It is an object of the present invention to provide a system and a method for determining a quasi-cyclic (QC) low-density parity-check (LDPC) code corresponding to a protograph, such that the QC LDPC code has a predetermined girth. Moreover, another object is to provide such a method, which can produce a QC LDPC code having girth equal to ten or greater.

Some embodiments of the invention are based on a realization that if the QC LDPC code has a hierarchical structure, the parity check matrix representing the hierarchical quasi-cyclic (HQC) LDPC code can be modified such that short cycles in a Tanner graph of the code are removed. The parity check matrix of an HQC LDPC codes includes multiple levels, wherein each level is formed by circulant sub-matrices. Specifically, each of the circulant sub-matrices forming a level includes circulant sub-sub-matrices, and so on for multiple levels.

Some embodiments of the invention are based on another realization that if values of elements of a connectivity matrix representing the protograph form a predetermined pattern, the QC LDPC code generated by a direct transformation of the protograph inevitably has short cycles. The predetermined pattern is girth specific. For example, if the predetermined girth is at least ten, the pattern includes a row or a column of the connectivity matrix having at least two elements with values greater than two or at least one element with a value greater than three. Hence, to remove cycles, the matrix, representing the HQC LDPC code has to be modified in dependence of the values of the elements of the connectivity matrix forming the indicated pattern.

Some embodiments of the invention are based on yet another realization that if some elements of the connectivity matrix indicated by the predetermined girth are duplicated along a line of duplication, an HQC LDPC code corresponding to that inflated connectivity matrix can be squashed along the line of duplication to produce the QC LDPC code.

Therefore, some embodiments of the invention disclose a method for determining a quasi-cyclic (QC) low-density parity-check (LDPC) code corresponding to a protograph represented by a connectivity matrix, such that the QC LDPC code has a predetermined girth. Steps of the method include duplicating at least several elements of the connectivity matrix to produce an inflated connectivity matrix, wherein values of at least several elements in the connectivity matrix form a pattern indicated by the predetermined girth; determining a hierarchical quasi-cyclic (HQC) LDPC code corresponding to the inflated connectivity matrix; and removing at least several elements of a matrix representing the HQC LDPC code, such that the matrix is squashed along a line of duplication to produce the QC LDPC code, wherein the steps of the method are performed by a processor.

In some embodiments, the predetermined girth is ten or greater, the protograph can represent a spatially-coupled code, and/or the HQC LDPC code can be a restricted two-level HQC LDPC code. In one embodiment, the determining of the HQC LDPC code involves transforming the inflated connectivity matrix into a family of hierarchical quasi-cyclic (HQC) LDPC codes; and selecting at least one HQC LDPC code from the family of HQC LDPC codes such that the girth of the HQC LDPC code is optimized.

For example, the selecting can use a hill-climbing procedure to optimize the girth. The hill-climbing procedure can include steps of: selecting a tree structure for each HQC LDPC code in the family; determining a cost for each tree structure; changing repeatedly a single edge label in the tree structure to maximize a reduction in the cost; and constructing the polynomial parity check matrix for HQC LDPC code from the tree structure when the cost is at a minimum.

Also, in one embodiment, the transforming may be a direct transformation of the connectivity matrix into the family of restricted two-level HQC LDPC codes. Additionally or alternatively, the transforming step may transform the inflated connectivity matrix into a family of polynomial parity check matrices describing a corresponding family of HQC LDPC codes, wherein an element of a polynomial parity check matrix includes a polynomial in first variable x and a second variable y, and wherein exponents of the second variable y on both sides of the line of duplication are equal. Also, the selecting may optionally include optimizing degrees of freedom in the family of polynomial parity check matrices to obtain the HQC LDPC code; and converting the polynomial parity check matrix of the HQC LDPC into a base matrix code to produce the matrix of the HQC LDPC code. The squashing procedure may remove two columns in the base matrix code from each set of four columns corresponding to each duplicated column in the inflated connectivity matrix, and further removes two rows in the base matrix from each set of four rows corresponding to each duplicated row in the inflated connectivity matrix.

Also, in various embodiments, the HQC LDPC code is represented by a polynomial parity check matrix, and by a base matrix. For example, the base matrix may be constructed using four-by-four sub-matrices. Some embodiments convert the polynomial parity check matrix to the base matrix.

Typically, the line of duplication extends between rows or between columns of the connectivity matrix. Also, the element of the connectivity matrix is a row or column that can correspond to N rows or columns respectively of the matrix representing the code. The duplicating may comprise making N/2 duplicates and the removing may further include removing all but two elements from the matrix on both sides of the line of duplication. For example, if N equals four, the removing includes removing two rows or columns from the two duplicates of the rows or columns of the matrix on both sides of the line of duplication.

Another embodiment discloses a system for encoding data based on a quasi-cyclic (QC) low-density parity-check (LDPC) code, including a source for providing the data; a memory for storing HQC LDPC code represented by a parity check matrix, wherein each sub-matrix of the matrix has a circulant structure, wherein values of the elements of the sub-matrix change the circulant flow over a transitional line; and an encoder for encoding the data using the HQC LDPC code to produce encoded data, and for transmitting the encoded data over a channel.

BRIEF DESCRIPTION OF THE DRAWINGS

FIGS. 5A-B and 6 are examples of protographs;

DETAILED DESCRIPTION OF THE PREFERRED EMBODIMENT

System and Method Overview

Figure 1:
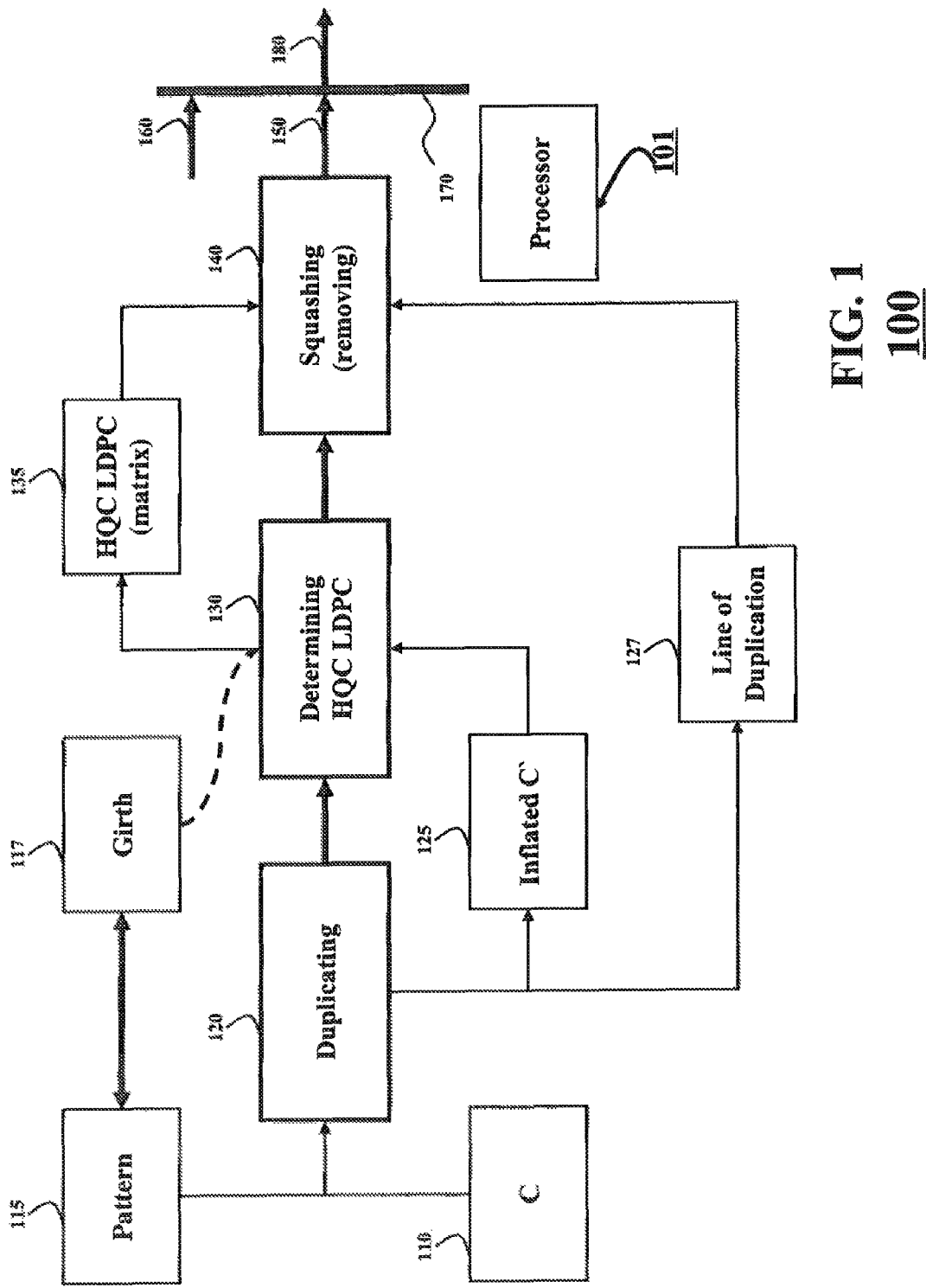
FIG. 1 is a block diagram of a method for determining a quasi-cyclic (QC) low-density parity-check (LDPC) code according to some embodiments of an invention.

FIG. 1 shows a block diagram of a method 100 for determining a quasi-cyclic (QC) low-density parity-check (LDPC) code 150. The QC LDPC code is determined according to a protograph represented by a connectivity matrix (C) 110, such that the QC LDPC code has a predetermined girth 117. The steps of the method are performed by a processor 101. The QC LDPC code 150 can be stored in a memory (not shown), and can used to encode 170 data 160 to produce encoded data 180 for transmission over wireless or wired channel. The data can also be stored in a memory.

Some embodiments of the invention are based on a realization that if some elements of the connectivity matrix indicated by the predetermined girth are duplicated to from an inflated connectivity matrix along a line of duplication. A hierarchical quasi-cyclic (HQC) LDPC code corresponding to the inflated connectivity matrix can be squashed along the line of duplication to produce the QC LDPC code. A matrix of circulant sub-matrices representing the HQC LDPC codes includes multiple levels, wherein each level is formed by the circulant sub-matrices. Specifically, the circulant sub-matrices forming a level include circulant sub-sub-matrices, and so on for each of the multiple levels.

Figure 2A:
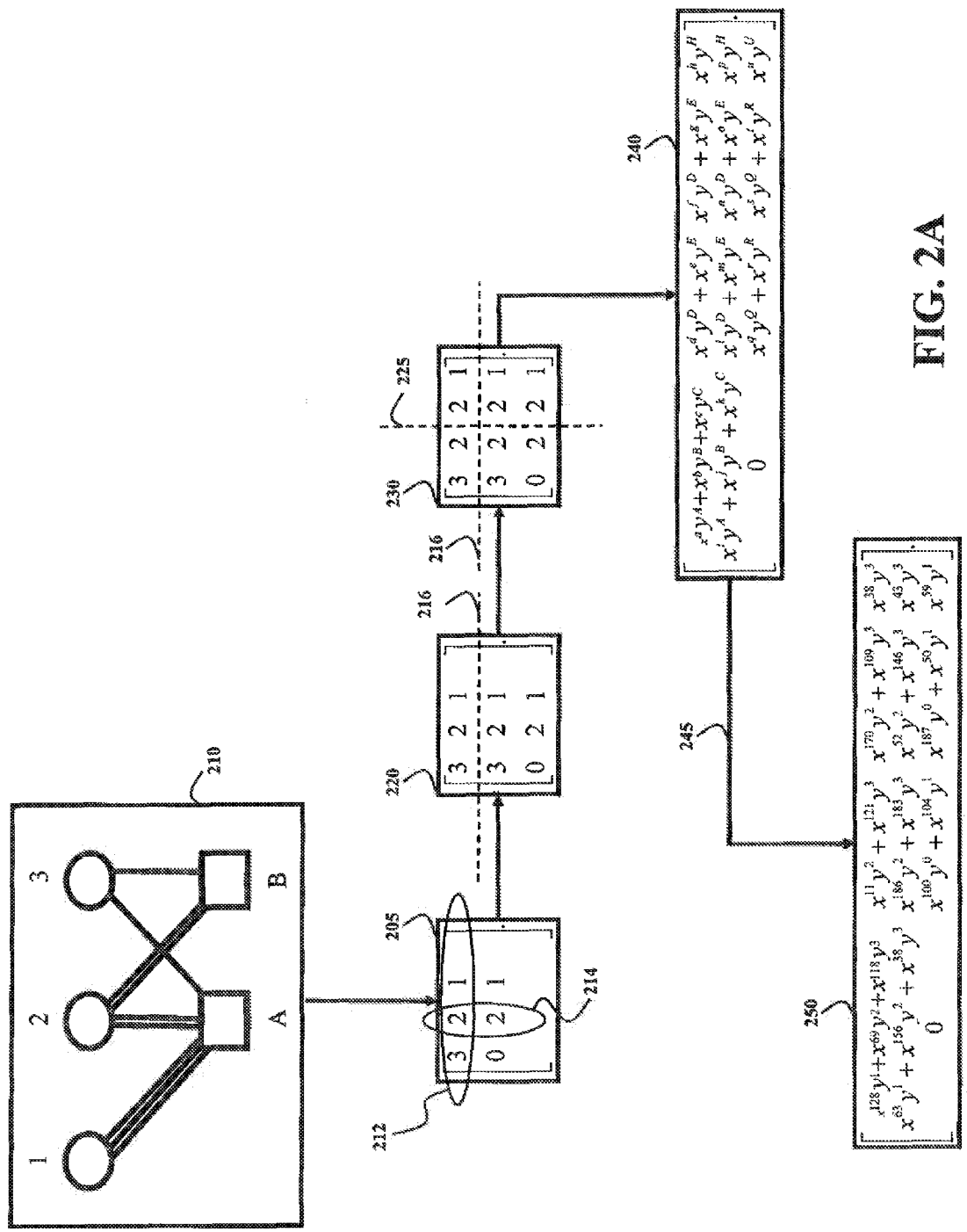
FIGS. 2A-B are schematics of an example for determining the QC LDPC code according to one embodiment.
Figure 2B:
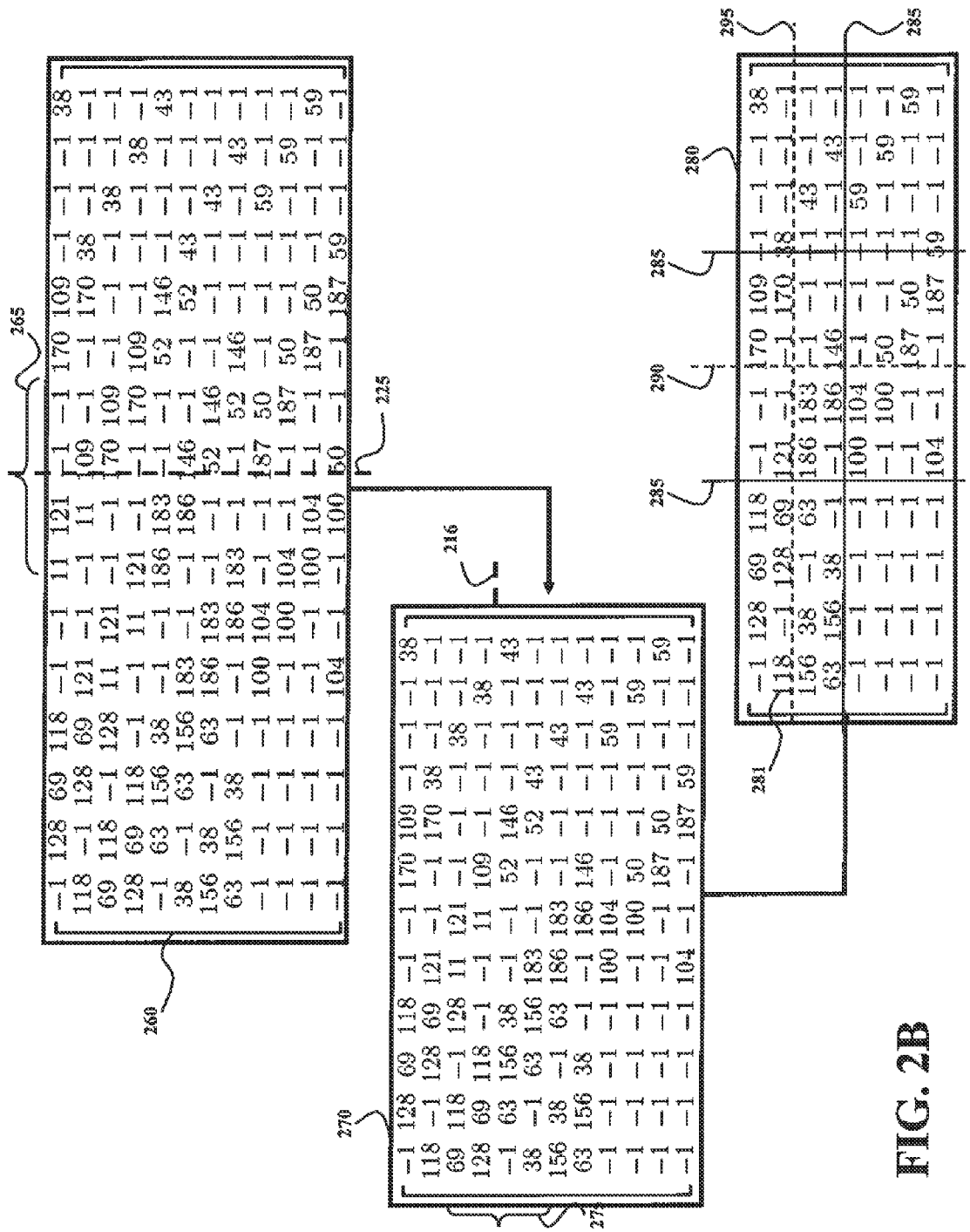

FIGS. 2A-B show a non-limited example of determining the QC LDPC code according to the protograph, such as protograph 210. This example helps to explain the steps of the method 100 and is not intended to limit the scope of the invention.

A "protograph" is a template that can be used to derive a class of Tanner graphs. Each node in a protograph represents a "type" of node in the Tanner graph. The nodes are duplicated p times in the Tanner graph derived from the protograph. For example, the protograph 210 includes three types of variable nodes labeled 1, 2, and 3, and two types of check nodes labeled A and B. In order to derive the Tanner graph based on this protograph, each check node of type A is connected to three variables of type 1, two variables of type 2, and one variable of type 3, while each check node of type B should be connected to two variables of type 2 and one variable of type 3.

Every protograph can be equivalently represented by the connectivity matrix. The connectivity matrix has a number of rows equals to the number of types of checks in the protograph and a number of columns equals to the number of types of variables. Each element in the connectivity matrix is a weight corresponding to a number of edges connecting a type of a check node to a type of a variable node in the protograph. For the sake of the example, the protograph 210 can be represented by the connectivity matrix 205

$$C = \begin{bmatrix} 3 & 2 & 1 \\ 0 & 2 & 1 \end{bmatrix}.$$

The protograph shown in FIG. 2A is only a small example provided for the purpose of illustrating our method. FIGS. 5A and 5B show other examples of protographs that can be used as inputs for our method. These protographs represent "one-sided spatially coupled codes." Notice that there are multiple edges connecting bit types and check types in these protographs.

Some embodiments of the invention are based on another realization that if values of elements of a connectivity matrix form a predetermined pattern 115, the QC LDPC code obtained by a "direct transformation" of the protograph inevitably has short cycles of length six or eight. The predetermined pattern is girth specific. For example, if the desired or predetermined girth is at least ten, the patterns include a row or a column of the connectivity matrix having at least two elements with values greater than two or at least one element with a value greater than three. For example, the connectivity matrix 205 includes a row 212 and a column 214 according to the pattern 115 indicated by the girth equals ten.

Hence, to obtain a QC LDPC code without inevitable short cycles, the connectivity matrix is duplicated along a line of duplication 127, e.g., lines 216 and 225, to produce an inflated connectivity matrix 125. The duplication can have a number of intermediate steps corresponding to the number of rows or columns indicated by pattern 115. In the example shown in FIG. 2A, the line of duplication includes lines 216 and 225 forming inflated connectivity matrixes 220 and, eventually, 230. As used herein, the line of duplication is a line over which the elements forming a pattern are duplicated. Typically, the line of duplication is a line between rows or columns of the matrix. The line of duplication preserves information about which row or column is duplicated.

Next, a hierarchical quasi-cyclic (HQC) LDPC code 135 corresponding to the inflated connectivity matrix 125 is determined 130. For example, the inflated connectivity matrix 230 can be transformed into a family of hierarchical quasi-cyclic (HQC) LDPC codes 240, and the HQC LDPC code 250 is selected 245 such that the girth of the HQC LDPC code is optimized. One embodiment uses a hill-climbing procedure to optimize the girth, as described below.

A matrix 260 shown in FIG. 2B is an example of the matrix 135 representing the HQC LDPC code. The matrix 260 is a "base matrix." In some embodiments, the HQC LDPC code is represented by a polynomial parity check matrix, as described in more detail below, and the polynomial parity check matrix is converted into the base matrix to produce the matrix. In our example, the matrix 260 includes 4-by-4 circulant sub-matrices and describes a weight-I QC LDPC code.

The matrix 135 corresponds to the inflated connectivity matrix 125 C'. Thus, at least several elements of the matrix 135 are removed to produce the QC LDPC code for the original connectivity matrix C 110. Specifically, in various embodiments the matrix 135 is squashed 140 along the line of duplication. Typically, the row or column of the inflated connectivity matrix corresponds to N rows or columns of the base matrix. Accordingly, the squashing removes rows or columns from the base matrix on both sides of the line of duplication. In the example of FIGS. 2A-B, N equals four, i.e., each column of the inflated connectivity matrix 230 corresponds to four columns in the matrix 260. Hence, the squashing includes removing two columns from the matrix 260 on both sides of the line of duplication. Specifically, two columns 265 are removed on both sides of the duplication line 225 producing a matrix 270. Similarly, two rows 275 are removed on both sides of the duplication line 216 producing a matrix 280.

The matrix 280 is an example of the QC LDPC code 150. As can be seen from the exemplar matrix, the QC LDPC code 150, determined by some embodiments of the invention, has a special structure. The code includes sub-matrices. For example, the code 280 includes six sub-matrices, as indicated by lines 285. Each sub-matrix 281 has a circulant structure, but values of the elements of the sub-matrix change the circulant flow over a transitional line, such as lines 290 and 295. This is because the code 280 is formed by squashing the matrix representing the HQC LDPC code.

The above steps of the method 100 are described in greater detail below using a set of examples. Those examples are not intended to limit the scope of the invention.

Quasi-Cyclic LDPC Codes

Before considering QC LDPC codes in general, it is useful to define an important special case, called "weight-I (J, L) regular" QC LDPC codes. The parity check matrix of these codes is composed from J·L submatrices, each of which is a p×p circulant permutation matrix.

Let $I_{i,p}$ denote a circulant permutation matrix, or "cyclic shift matrix," obtained by cyclically right-shifting a p×p identity matrix by i positions, where $0 \leq i \leq p-1$; $I_{0,p}$ is thus the p×p identity matrix. In this disclosure, we suppress the dependence on p, writing $I_i$ instead of $I_{i,p}$. As an example, if p=4, then $$I_1 = \begin{bmatrix} 0 & 1 & 0 & 0 \\ 0 & 0 & 1 & 0 \\ 0 & 0 & 0 & 1 \\ 1 & 0 & 0 & 0 \end{bmatrix}.$$

The parity check matrix of a weight-I (J,L) QC LDPC code is:

$$H = \begin{bmatrix} I_{i_{1,1}} & I_{i_{1,2}} & \cdots & I_{i_{1,L}} \\ I_{i_{2,1}} & I_{i_{2,2}} & \cdots & I_{i_{2,L}} \\ \vdots & & \ddots & \vdots \\ I_{i_{J,1}} & I_{i_{J,2}} & \cdots & I_{i_{J,L}} \end{bmatrix}. \quad (1)$$

The block length of such a code is N=pL.
Using $I_k = (I_1)^k$, the parity check matrix can be rewritten as $$H = \begin{bmatrix} (I_1)^{i_{1,1}} & (I_1)^{i_{1,2}} & \cdots & (I_1)^{i_{1,L}} \\ (I_1)^{i_{2,1}} & (I_1)^{i_{2,2}} & \cdots & (I_1)^{i_{2,L}} \\ \vdots & & \ddots & \vdots \\ (I_1)^{i_{J,1}} & (I_1)^{i_{J,2}} & \cdots & (I_1)^{i_{J,L}} \end{bmatrix}. \quad (2)$$

The matrix H can also be abstractly represented as a matrix with entries that are powers of a dummy variable x:

$$H(x) = \begin{bmatrix} x^{i_{1,1}} & x^{i_{1,2}} & \cdots & x^{i_{1,L}} \\ x^{i_{2,1}} & x^{i_{2,2}} & \cdots & x^{i_{2,L}} \\ \vdots & & \ddots & \vdots \\ x^{i_{J,1}} & x^{i_{J,2}} & \cdots & x^{i_{J,L}} \end{bmatrix}. \quad (3)$$

The matrix H(x) can be generalized to a parity check matrix whose entries are polynomials in x, resulting in a polynomial parity check matrix of a standard QC LDPC code:

$$H(x) = \begin{bmatrix} h_{1,1}(x) & h_{1,2}(x) & \cdots & h_{1,L}(x) \\ h_{2,1}(x) & h_{2,2}(x) & \cdots & h_{2,L}(x) \\ \vdots & & \ddots & \vdots \\ h_{J,1}(x) & h_{J,2}(x) & \cdots & h_{J,L}(x) \end{bmatrix}, \quad (4)$$

where $$h_{j,l}(x) = \sum_{s=0}^{p-1} c_s[j,l] x^s \quad (5)$$

for $1 \leq j \leq J$, $1 \leq l \leq L$.
For binary QC LDPC codes, the polynomial coefficients $c_s[j,l]$ are 0 or 1.

Example 1

Let C be a length-9 QC LDPC code described by a parity check matrix $$H = \begin{bmatrix} 1 & 0 & 0 & 1 & 0 & 0 & 1 & 0 & 0 \\ 0 & 1 & 0 & 0 & 1 & 0 & 0 & 1 & 0 \\ 0 & 0 & 1 & 0 & 0 & 1 & 0 & 0 & 1 \\ 0 & 0 & 0 & 1 & 0 & 0 & 0 & 1 & 1 \\ 0 & 0 & 0 & 0 & 1 & 0 & 1 & 0 & 1 \\ 0 & 0 & 0 & 0 & 0 & 1 & 1 & 1 & 0 \end{bmatrix}. \quad (6)$$

For this code, J=2, L=3, and p=3, and the matrix H can be written as $$H = \begin{bmatrix} I_0 & I_0 & I_0 \\ 0 & I_0 & I_1 + I_2 \end{bmatrix}. \quad (7)$$

The polynomial version of the parity check matrix is $$H(x) = \begin{bmatrix} x^0 & x^0 & x^0 \\ 0 & x^0 & x^1 + x^2 \end{bmatrix} = \begin{bmatrix} 1 & 1 & 1 \\ 0 & 1 & x^1 + x^2 \end{bmatrix}. \quad (8)$$

QC LDPC codes can be classified according to the maximum weight among the circulant sub-matrices in their parity check matrix, or equivalently, according to the maximum weight of the polynomials in their polynomial parity check matrix. The weight of a polynomial is the number of non-zero terms in that polynomial. A "weight-M" QC LDPC code is defined as one for which the maximum weight among all polynomial entries $h_{j,l}(x)$ in H(x) is M.

Because $wt(h_{2,3}(x))=2$ in the code of Example 1, i.e., $h_{2,3}(x)=x^1+x^2$ is a binomial, and because $wt(h_{2,3}(x)) \geq wt(h_{j,l}(X))$ for all $1 \leq j \leq J$, $1 \leq l \leq L$, the code in Example 1 is a weight-II QC LDPC code.

In this description, we define the base matrix of a weight-I QC LDPC code to be the J×L matrix of powers (circulant shifts) that defines the code, i.e., $\log_x(H(x))$, where logarithms are taken entry-by-entry, and where we define $\log_x(0)$ to be −1 to indicate an all-zero sub-matrix. For example, the base matrix corresponding to the parity check matrix (3) is $$B = \begin{bmatrix} i_{1,1} & i_{1,2} & \cdots & i_{1,L} \\ i_{2,1} & i_{2,2} & \cdots & i_{2,L} \\ \vdots & & \ddots & \vdots \\ i_{J,1} & i_{J,2} & \cdots & i_{J,L} \end{bmatrix}. \quad (9)$$

Graphical Representations of QC LDPC Codes

An LDPC code can either be represented by its parity check matrix H, or equivalently by its Tanner graph. The Tanner graph for an LDPC code is a bi-partite graph including "variable" nodes representing the codeword bits, and "check" nodes representing the parity checks, where a variable node is connected to a check node by an edge if and only if the corresponding entry in H is nonzero. The degree of a node is defined as the number of edges incident to that node.

A "protograph" can be used as a template to derive a class of Tanner graphs. Each node in a protograph represents a "type" of node in a Tanner graph. The nodes are duplicated p times in the Tanner graph derived from the protograph.

Figure 6:
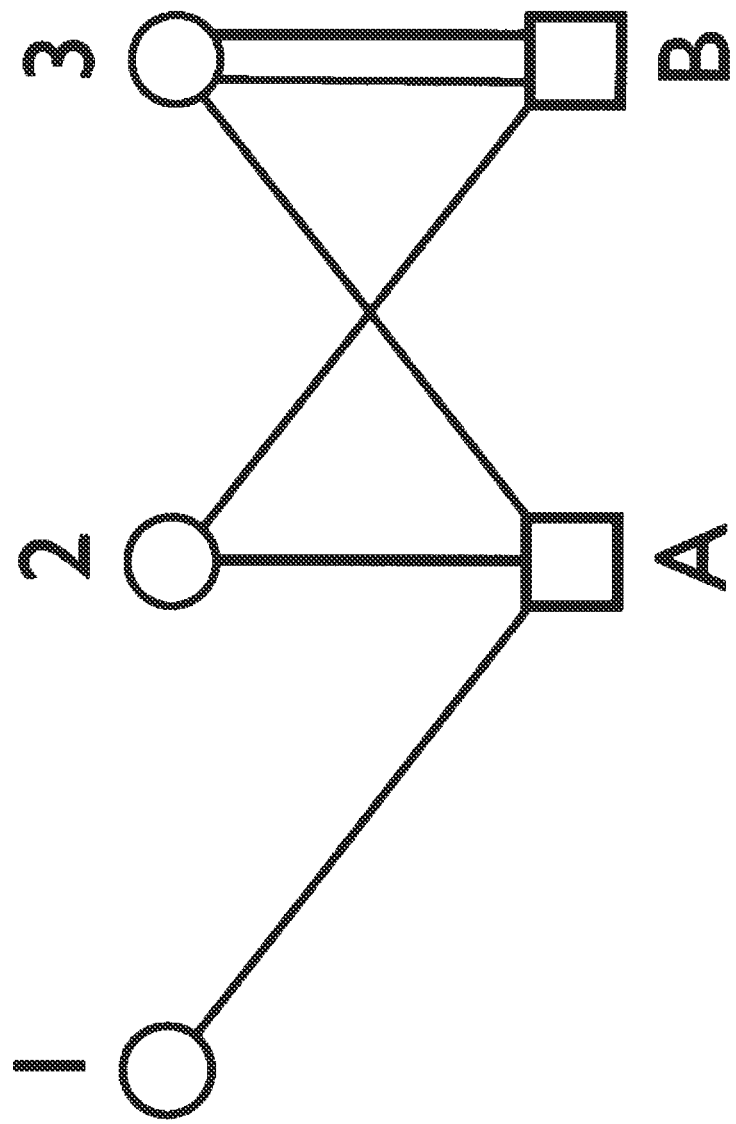

FIG. 6 shows an example protograph that has three types (1, 2, 3) of variable nodes and two types (A, B) of check nodes. Each check of type A is connected to one variable of each of the three types, and each check of type B is connected to one variable of type 2 and two variables of type 3. Similarly, each variable of type 1 is connected to one check of type A, and so on.

Figure 7A:
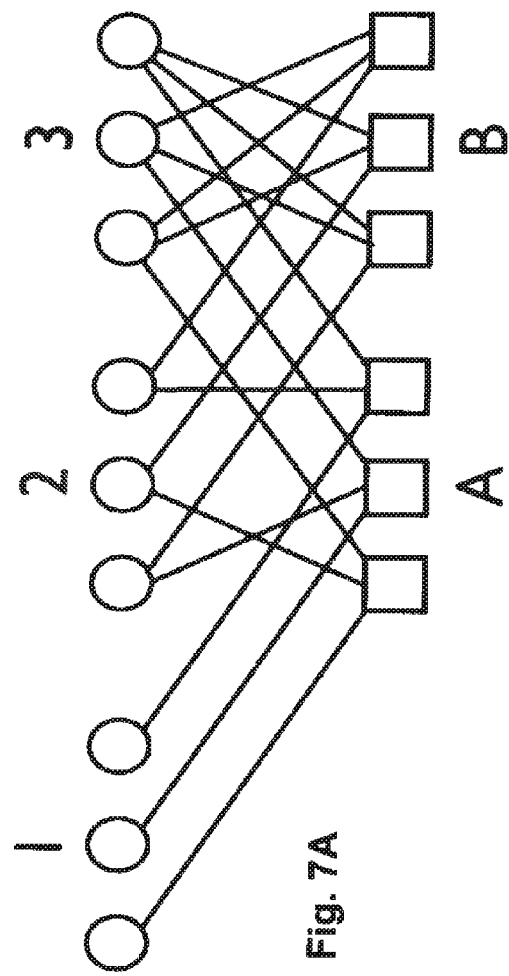
FIGS. 7A-B are examples of two Tanner graphs derived from the protograph of FIG. 6.
Figure 7B:
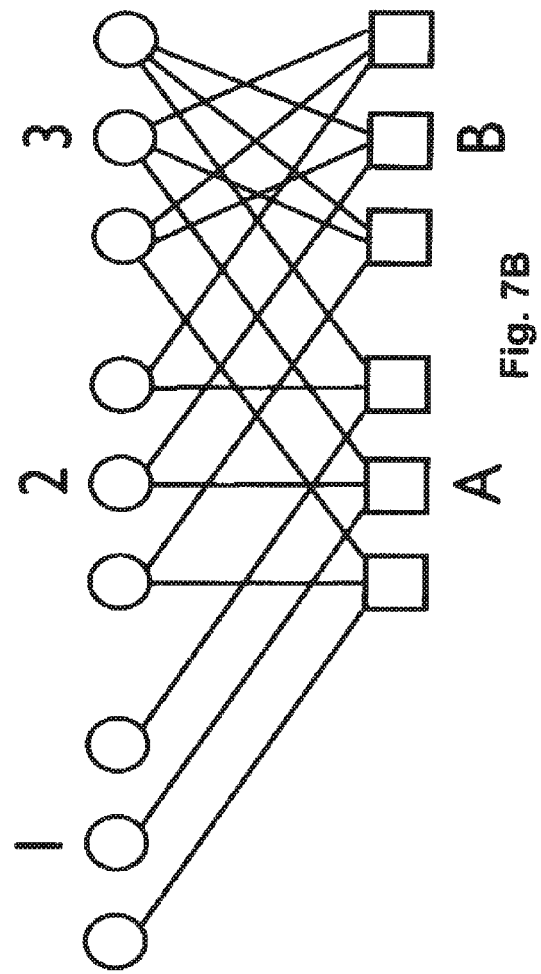

FIGS. 7A-7B show two Tanner graphs derived from the protograph of FIG. 6, with p=3. There are many possible Tanner graphs that correspond to a particular protograph, and they need not necessarily have a quasi-cyclic structure. The Tanner graph in FIG. 7A does not have a quasi-cyclic structure. In contrast, the Tanner graph in FIG. 7B does, and in fact, has the parity check matrix of the QC LDPC code given in Example 1.

A protograph can equivalently be described by a connectivity matrix. A connectivity matrix has a number of rows equal to the number of types of checks in the protograph and a number of columns equal to the number of types of variables. Each entry in the connectivity matrix describes how many edges there are connecting a type of check node to a type of variable node in the protograph. For example, the connectivity matrix C for the protograph shown in FIG. 1 is $$C = \begin{bmatrix} 1 & 1 & 1 \\ 0 & 1 & 2 \end{bmatrix}. \tag{10}$$

To derive a quasi-cyclic parity-check matrix H(x) from the template specified by a particular protograph, each entry in the corresponding connectivity matrix can be replaced with a polynomial of weight equal to the entry. This procedure is called a "direct transformation" of a protograph into a QC LDPC code.

For example, the protograph that has the connectivity matrix C given in equation (10), can be directly transformed into a QC LDPC code with parity check matrix $$H(x) = \begin{bmatrix} x^a & x^b & x^c \\ 0 & x^d & x^e + x^f \end{bmatrix}, \tag{11}$$

where a, b, c, d, e and f are integer exponents between 0 and p−1, with e≠f.

There are many possible direct transformations of a protograph into a QC LDPC code, depending on what exponents one chooses for the polynomials. For example, the connectivity matrix (10) can be directly converted into the QC LDPC code with parity check matrix $$H(x) = \begin{bmatrix} x^0 & x^0 & x^0 \\ 0 & x^0 & x^1 + x^2 \end{bmatrix}. \tag{12}$$

Cycles in QC LDPC Codes

A cycle is a path through nodes in the Tanner graph, alternating between check and variable nodes, which starts and ends at the same node. In terms of the parity check matrix code, a cycle can be characterized as a sequence of alternating vertical horizontal moves through the matrix starting, and ending on the same row of the matrix. A vertical move (along a column) corresponds to a second edge connected to the same variable node that forms next step in the cycle. A horizontal move (along a row) corresponds to two edges connected to the same check node that forms a part of the path.

Figure 3B:
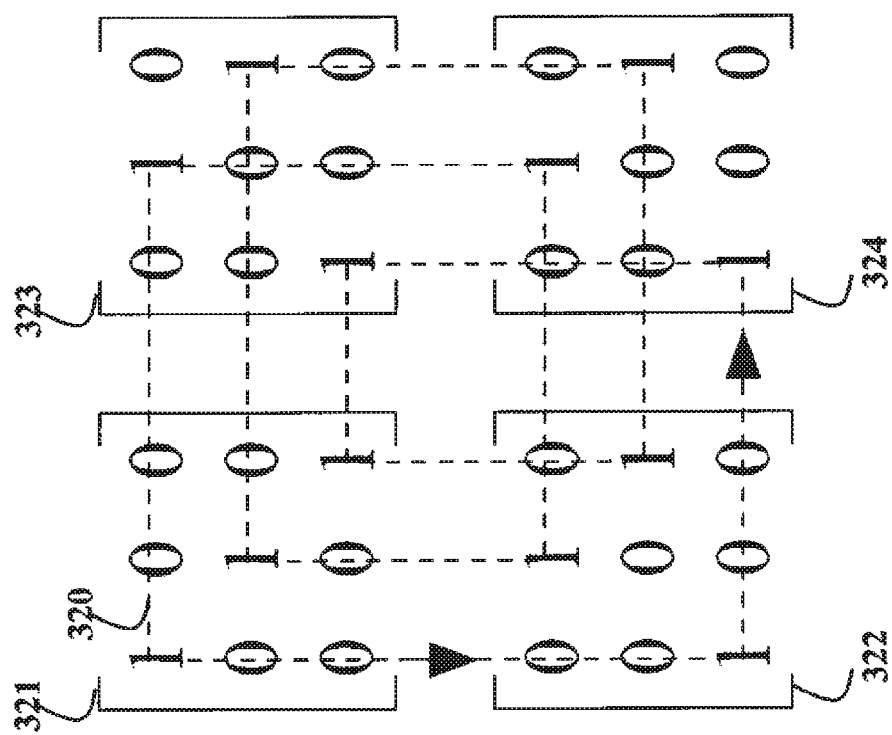
FIGS. 3A-B are examples of paths forming a cycle in a matrix and graph representation.
Figure 3A:
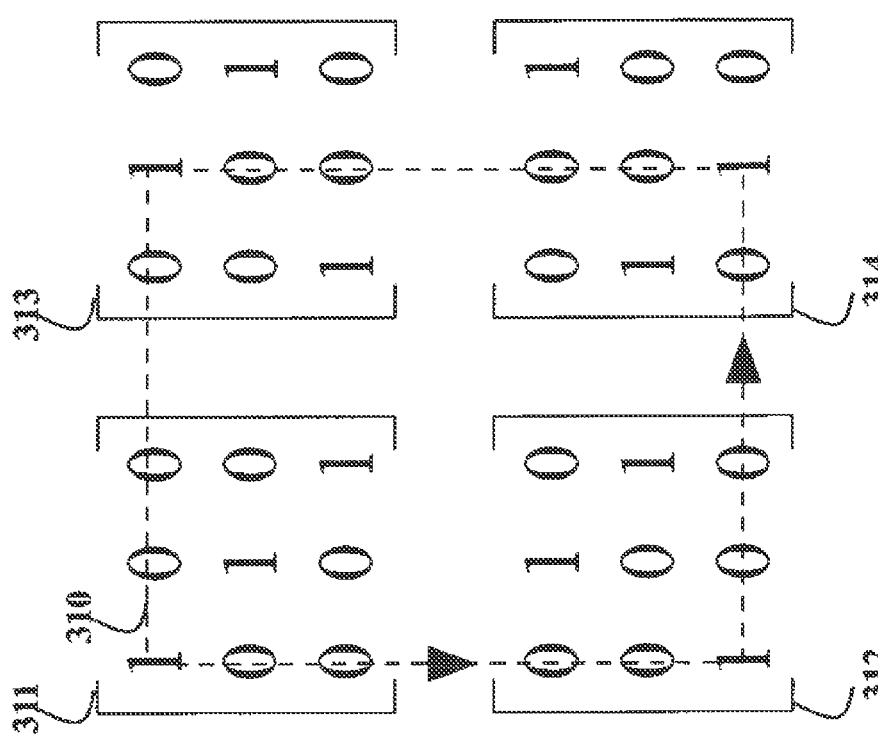

For example, consider the parity check matrix of a weight-I QC LDPC code with parameters J=4, L=9, and p=3. In this example, the parity check matrix includes four 3×3 cyclic shift sub-matrices arranged in a rectangular pattern in the parity check matrix. FIGS. 3A-B shows two choices for the parameters of these four matrices. FIG. 3A shows matrices 311-314 with parameters a=0, b=1, c=2, and d=1, respectively, wherein parameters {a,b,c,d} indicate shift from the identity matrix. FIG. 3B shows matrices 321-324 with respective parameters a=0 b=c=d=1.

The necessary and sufficient condition for cycles to exist is that when the path through the base matrix returns to the starting entry, the path returns to the same column of the cyclic shift matrix from which it started. For example, consider the path through the all four matrices. The path 310 results in a cycle of length four. However, slightly different choice of circulant shifts of the example in FIG. 3B, a return to the same column of the cyclic shift matrix occurs only after two more passes around the base matrix and results in a path 320 having a cycle of length 12.

Conditions on the {a,b,c,d}, which result in a set of p cycles, can be calculated according the following method. Calculate an alternating sum of the shift indices associated with neighboring permutation matrices along a given path, where every odd shift index is subtracted rather than added. For example, consider the left-hand path of FIGS. 3A-B. The sum is −a+b−c+d. Each difference between neighboring shift indices in the sum corresponds to the shift in what column, i.e., what variable node, of the cyclic permutation matrices the path passes through. Only if the differences sum to zero (mod-p) at the end of the path will the path return to the same variable node in the starting permutation matrix, thereby forming a cycle. For the example of FIG. 3A, the condition for a length-four cycle to exist is:

$$(-a+b-c+d) \bmod p = 0, \tag{13}$$

which is satisfied for a=0, b=1, c=2, d=1, but is not satisfied by a=0, b=c=d=1.

Consider the more involved example of the weight-II code defined by the 2×3 polynomial parity-check matrix $$H(x) = \begin{bmatrix} x^0 & x^0 & x^0 \\ 0 & x^0 & x^1 + x^2 \end{bmatrix}. \tag{14}$$

Also, consider the following ordered series:

$$O = \{(1,2),(2,2),(2,3),(2,3),(2,3),(1,3)\} \tag{15}$$

where each pair (j,l) in O satisfies 1≦j≦J=2 and 1≦l≦L=3. This ordered series specifies a sequence of rectilinear moves through H(x), where the first number in each pair specifies the row of H(x), and the second number specifies the column of H(x). To specify a candidate cycle through the Tanner graph, some embodiments associate a coefficient index s with each pair (j,l) in O, such that $c_s[j,l] \neq 0$, where $c_s[j,l]$ is defined according to equation (5). We denote this series of coefficient indices by S. To ensure that each step in the series corresponds to traversing a distinct edge in the Tanner graph we require the following of neighboring pairs (j⁻,l⁻) and (j⁺,l⁺) in O and the corresponding neighboring coefficient indices s⁻ and s⁺ in S: if (j⁻,l⁻)=(j⁺,l⁺), then the corresponding indices s⁻≠s⁺.

The candidate cycle is actually a cycle if the alternating sum of coefficient indices in S modulo p equals zero. In our example, consider the two following choices for the respective (ordered) sets of coefficient indices:

$$S_a = \{0,0,2,1,2,0\} \tag{16}$$

$$S_b = \{0,0,1,2,1,0\}. \tag{17}$$

Each of these choices corresponds to a cycle of length-6 through the Tanner graph of the code. The alternating sums modulo-3 can be verified to be equal to zero. Respectively these sums are:

$$(-0+0-2+1-2+0) \bmod 3 = (-3) \bmod 3 = 0 \tag{18}$$

$$(-0+2-1+2-1+0) \bmod 3 = (0) \bmod 3 = 0. \tag{19}$$

Unfortunately, higher-weight QC LDPC codes inevitably contain short cycles. Any weight-III QC LDPC code inevitably contains cycles of length six. Also, if the parity check matrix H(x) of a weight-II QC LDPC code contains two weight-two polynomials in the same row or the same column, that code inevitably has eight-cycles.

These inevitable six-cycles and eight-cycles put serious limitations on what protographs can be converted into quasi-cyclic codes with high girth using direct transformations. If, for example, the protograph has a type of variable that is connected to a type of check by three edges, a direct transformation will inevitably lead to six-cycles in the obtained QC LDPC code. This drawback is overcome by embodiments of the invention employing the method 100. In order to determine QC LDPC codes that have girth of ten or greater, some embodiments use hierarchical QC LDPC codes.

Hierarchical QC LDPC Codes

A hierarchical QC LDPC (HQC LDPC) code is formed from levels. Each level is formed by sub-matrices having a quasi-cyclic structure. The structure can be specified in at least two equivalent, complementary forms, i.e., one in terms of the polynomial parity check matrices of HQC LDPC codes, and another in terms of the "tree structure" of these HQC LDPC codes.

Example 2

For Example, consider the polynomial parity check matrix specified in equation (20) with p=8. Because the highest weight of any of the polynomial entries is 2, (e.g., $h_{1,3}(x) = x^1 + x^7$), and because there are 12 columns in the matrix, this is a length-96 weight-II QC LDPC code.

$$H(x) = \begin{bmatrix} x^2 & 0 & x^1+x^7 & 0 & x^7 & 1+x^6 & 0 & 0 & 0 & x^2 & x^5 & 1 \\ x^1+x^7 & x^2 & 0 & 1+x^6 & 0 & x^7 & 0 & 0 & 0 & 1 & x^2 & x^5 \\ 0 & x^1+x^7 & x^2 & x^7 & 1+x^6 & 0 & 0 & 0 & 0 & x^5 & 1 & x^2 \\ 0 & x^7 & 1+x^6 & x^2 & 0 & x^1+x^7 & x^2 & x^5 & 1 & 0 & 0 & 0 \\ 1+x^6 & 0 & x^7 & x^1+x^7 & x^2 & 0 & 1 & x^2 & x^5 & 0 & 0 & 0 \\ x^7 & 1+x^6 & 0 & 0 & x^1+x^7 & x^2 & x^5 & 1 & x^2 & 0 & 0 & 0 \end{bmatrix} \quad (20)$$

However, this parity check matrix has additional structure which makes it a hierarchical QC LDPC code. In particular, in this example, each 3×3 sub-matrix of polynomials in (20) has a circulant structure, as do both the left-hand and right-hand sets of 2×2 sub-matrices of 3×3 sub-matrices.

Just as we use polynomials in the dummy variable x to represent the underlying circulant sub-matrices in a standard QC LDPC code, we can use a bi-variate polynomial in the two dummy variables x and y to represent both the circulant matrices represented by the variable x in equation (20) as well as the circulant arrangements within each 3×3 sub-matrix of polynomials in x. The latter circulant structure is represented by the dummy variable y. We can further represent the 2×2 circulant structure of 3×3 circulant sub-matrices by the additional dummy variable z.

Thus, some embodiments for this example transform the 6×12 polynomial parity check matrix H(x) of equation (20) into the 2×4 bi-variate polynomial parity check matrix H(x,y) according to $$H(x, y) = \begin{bmatrix} x^2+(x+x^7)y^2 & x^7y+(1+x^6)y^2 & 0 & x^2+x^5y+y^2 \\ x^7y+(1+x^6)y^2 & x^2+(x+x^7)y^2 & x^2+x^5y+y^2 & 0 \end{bmatrix} \quad (21)$$

Some embodiments, repeat the process to transform H(x,y) into the 1×2 tri-variate polynomial parity check matrix H(x,y,z) according to $$H(x,y,z) = [x^2+(x+x^7)y^2+(x^7y+(1+x^6)y^2)z \mid (x^2+x^5y+y^2)z] \quad (22)$$

Each of the three representations of the parity check matrix of this code into the polynomial parity check matrices (20), (21), and (22), corresponds to a "level" in the hierarchy of this 3-level HQC LDPC code.

When constructing an HQC LDPC code, some embodiments proceed in the other direction, i.e., expanding a matrix like H(x,y,z) into H(x) and then ultimately into the full parity check matrix whose entries are ones and zeroes. To expand a polynomial matrix, the size of the circulant matrices at every level has to be known.

More formally, an HQC LDPC code can be described by the following definition.

Definition 1:

An HQC LDPC code with K levels is defined by a $J_{[K]} \times L_{[K]}$ multi-variate polynomial parity check matrix H(•) in K variables. The entry in the jth row and lth column of H(•), $1 \leq j \leq J_{[K]}$, $1 \leq l \leq L_{[K]}$ is a K-variate polynomial $h_{j,l}(\bullet, \ldots, \bullet)$ over the K variables, $x_{[1]}, \ldots, x_{[K]}$. The maximum exponent of any of these polynomials in $x_{[k]}$, $1 \leq k \leq K$, is $p_{[k]}-1$. The coefficient associated with the term $x_{[1]}^{s_1} \cdot x_{[2]}^{s_2} \ldots x_{[K]}^{s_K}$ where $0 \leq s_k \leq p_{[k]}-1$ for all k is $c_{s_1, \ldots, s_K}[j,l]$. With these definitions we defined the code by the $J_{[K]} \cdot L_{[K]}$ polynomials $$h_{j,l}(x_{[1]}, \ldots, x_{[K]}) = \sum_{s_K=0}^{p_{[K]}-1} \ldots \sum_{s_1=0}^{p_{[1]}-1} c_{s_1, \ldots, s_K}[j,l] \left( \prod_{k=1}^{K} x_{[k]}^{s_k} \right). \quad (23)$$

The parity check matrix of such a code is obtained by replacing each of the $J_{[K]} \cdot L_{[K]}$ entries of $H(x_{[1]}, \ldots, x_{[K]})$ with the sub-matrix $$\sum_{s_K=0}^{p_{[K]}-1} \ldots \sum_{s_1=0}^{p_{[1]}-1} c_{s_1, \ldots, s_K}[j,l] \left( I_{1,p_{[K]}}^{s_K} \otimes \ldots \otimes I_{1,p_{[1]}}^{s_1} \right) \quad (24)$$

where ⊗ denotes a Kronecker product. Defining the recursive relations $J_{[k-1]} = J_{[k]} \cdot p_{[k]}$ and $L_{[k-1]} = L_{[k]} \cdot p_{[k]}$, where $0 \leq k \leq K$, the parity check matrix thus constructed has $J_{[0]} = J_{[K]} \cdot \Pi_{k=1}^{K} p_{[k]}$ rows and $L_{[0]} = L_{[K]} \cdot \Pi_{k=1}^{K} p_{[k]}$ columns.

Example 2

Continued

The code of this example is a three-level HQC LDPC code. To describe this example using Definition 1, we first identify x with $x_{[1]}$, y with $x_{[2]}$, and z with $x_{[3]}$.

In this example $p_{[1]}=8$, $p_{[2]}=3$, $p_{[3]}=2$. Therefore, $J_{[3]}=1$, $L_{[3]}=2$; $J_{[2]}=2$, $L_{[2]}=4$; $J_{[1]}=6$, $L_{[1]}=12$; and $J_{[0]}=48$, $L_{[0]}=96$.

We can rewrite, e.g., the term $h_{1,1}(x,y,z)$ of (22) as $$h_{1,1}(x_{[1]}, x_{[2]}, x_{[3]}) = x_{[1]}^2 + (x_{[1]} + x_{[1]}^7)x_{[2]}^2 + \quad (25)$$

$$(x_{[1]}^7 x_{[2]} + (1 + x_{[1]}^6)x_{[2]}^2)x_{[3]}$$

$$= \sum_{s_3=0}^{1} \sum_{s_2=0}^{2} \sum_{s_1=0}^{7} c_{s_1,s_2,s_3}[1,1]$$

$$x_{[1]}^{s_1} x_{[2]}^{s_2} x_{[3]}^{s_3},$$

where all coefficients $c_{s_1,s_2,s_3}[1,1]$ are zero except for $$c_{2,0,0}[1,1]=c_{1,2,0}[1,1]=c_{7,2,0}[1,1]=c_{7,1,1}[1,1]=c_{0,2,1}[1,1]=c_{6,2,1}[1,1]=1. \quad (26)$$

To generate the form given in equation (4) of the polynomial parity check matrix $H(x_{[1]})$ of a QC LDPC code in one variable, some embodiments use the construction of (27) for all but the first level. We can replace each $h_{j,l}(x_{[1]}, \ldots, x_{[K]})$ with the polynomial matrix in $x_{[1]}$ $$\sum_{s_K=0}^{p_{[K]}-1} \cdots \sum_{s_1=0}^{p_{[1]}-1} c_{s_1,K,s_K}[j,l](I_{1,p_{[K]}}^{s_K} \otimes L \otimes I_{1,p_{[2]}}^{s_2})x_{[1]}^{s_1}. \quad (27)$$

The matrix $H(x_{[1]})$ is of size $J_{[1]} \times L_{[1]}$. Consider the final term of $h_{1,1}(x_{[1]}, x_{[2]}, x_{[3]})$, namely $(1+x_{[1]}^6)x_{[2]}^2 X_{[3]}$, corresponding to the non-zero coefficients $c_{0,2,1}[1,1]$ and $c_{6,2,1}[1,1]$. According to equation (27), the contribution of this term to $H(x_{[0]})$ is $$c_{0,2,1}[1,1](I_{1,2} \otimes I_{1,3}^2)x_{[1]}^0 + c_{6,2,1}[1,1](I_{1,2} \otimes I_{1,3}^2)x_{[1]}^6,$$

where $c_{[1]}^0=1$, $c_{1,2,1}[1,1]=c_{6,2,1}[1,1]=1$ and $$I_{1,2} \otimes I_{1,3}^2 = \begin{bmatrix} 0 & 0 & 0 & 0 & 0 & 1 \\ 0 & 0 & 0 & 1 & 0 & 0 \\ 0 & 0 & 0 & 0 & 1 & 0 \\ 0 & 0 & 1 & 0 & 0 & 0 \\ 1 & 0 & 0 & 0 & 0 & 0 \\ 0 & 1 & 0 & 0 & 0 & 0 \end{bmatrix}. \quad (28)$$

The form of equation (27) reveals the structure of some HQC LDPC codes. Each row and each column of the matrix $I_{1,p_{[K]}}^{s_K} \otimes \ldots \otimes I_{1,p_{[2]}}^{s_2}$ has exactly one non-zero element. If the coefficient $c_{s_1, s_2, \ldots, s_K}[j,l]$ is non-zero, the permutation matrix $I_{1,p_{[1]}}^{s_1}$ (equivalent to the term $x_{[1]}^{s_1}$) is added at the location of each of these non-zero elements.

Tree Structure of HQC LDPC Codes

The tree structure of any HQC LDPC code can be represented by a matrix of labeled trees, e.g., based on Definition 2, below. The basic observation that motivates the following definitions is that the non-zero terms of the polynomials that define any HQC LDPC code have a hierarchical clustering that can be represented by a labeled tree. We formally define such a labeled tree as follows.

Definition 2:

A labeled tree T, corresponding to an entry in the $J_{[K]} \times L_{[K]}$ multi-variate polynomial parity check matrix $H(\bullet)$ in K variables defining a K-level HQC LDPC code, is defined by K levels, 1, . . . , K. The root node of each tree is the single node at the top (Kth) level. Each node at level k, $1 \leq k \leq K$, has a number of edges connecting it to nodes in the next level down. The number of edges is an integer in the set $\{1, \ldots, p_{[k]}-1\}$.

Figure 4:
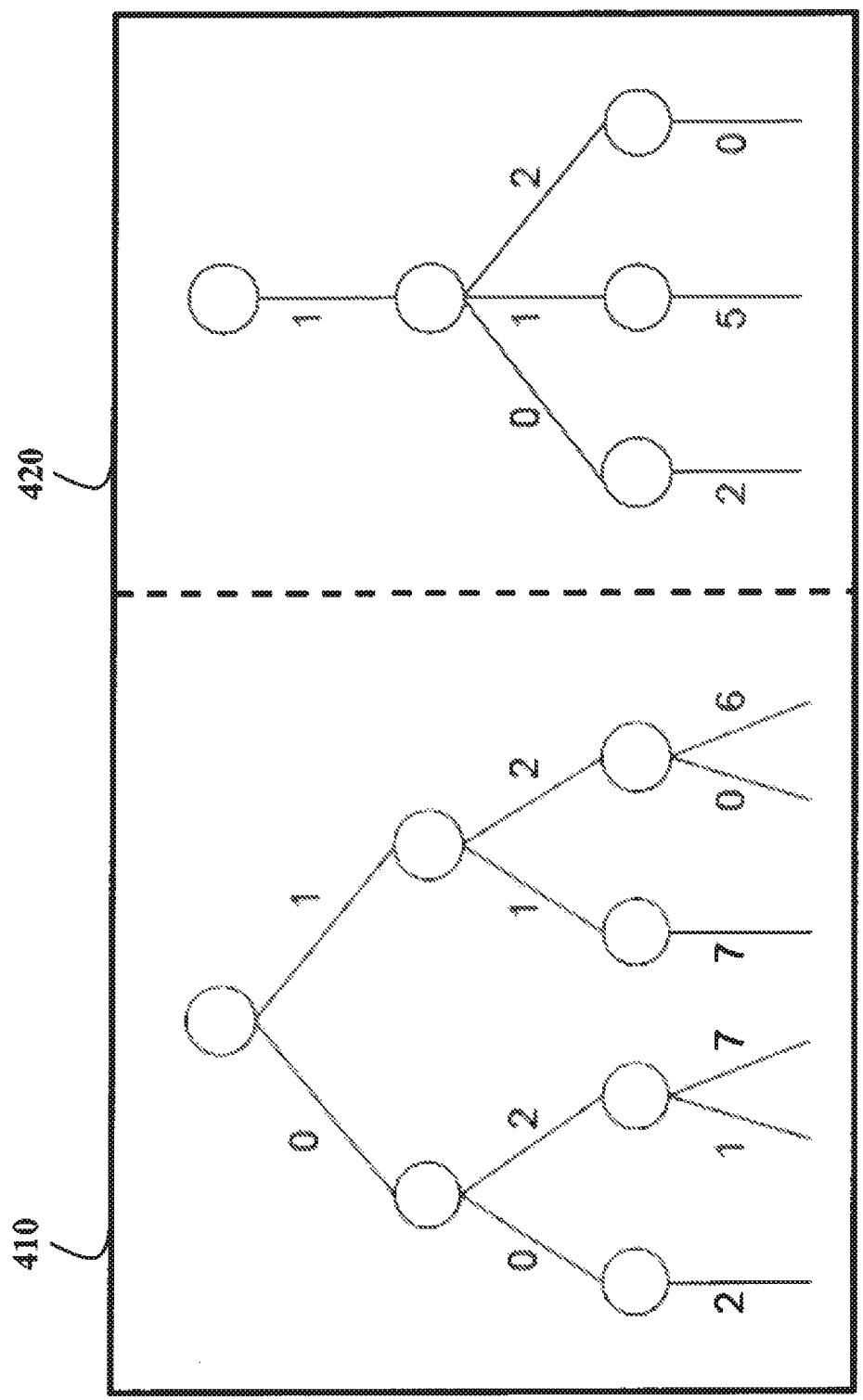
FIG. 4 is an example of a tree matrix representing an HQC LDPC code.

FIG. 4 shows an example of the tree structure of a three-level hierarchical QC LDPC codes. Each edge below a node at level k is labeled by an integer in the set $\{0, 1, \ldots, p_{[k]}-1\}$ Edges are termed "siblings" if the edges share the same parent, i.e., connected to the same node at the higher level. The edge labels of sibling nodes are constrained to be distinct. We refer to the edges below the lowest nodes as "leaves." We use $|T[k]|$ to denote the number of edges in T at level k, i.e., the set of edges that have a parent node at level k. The tree 410 is $T_{1,1}$, the tree 420 is $T_{1,2}$.

The code discussed in Example 2 is characterized by the matrix of two labeled trees shown in FIG. 4. The tree 410 characterizes the polynomial $h_{1,1}(x,y,z)$ and the tree 420 characterizes $h_{1,2}(x,y,z)$, as specified in equation (22).

Definition 3:

The tree structure of a K-level HQC LDPC code is specified by a matrix of labeled trees $T=\{T_{j,l}\}$, $1 \leq j \leq J_{[K]}$, $1 \leq l \leq L_{[K]}$. To each leaf of $T_{j,l}$ we associate a single non-zero coefficient $c_{s_1, \ldots, s_K}[j,l]$ in a one-to-one manner. If the edge labels on the unique path from the leaf to the root node are $e_1, \ldots, e_K$ then the non-zero coefficient associated with the leaf is $c_{e_1, \ldots, e_K}[j,l]=1$.

In certain cases (corresponding to all-zero polynomials) we want to define a "null" tree. This is a non-existent tree (and therefore no edges exist so all coefficients are zero). We use the special symbol * to denote the null tree.

The number of edges below level K of tree $T_{j,l}$ indicates the number of distinct powers of $x_{[K]}$ that appear in $h_{j,l}(x_{[1]}, \ldots, x_{[K]})$. Each node at level K–1 corresponds to one of these terms. The number of edges below each of the nodes at level K–1 indicates the number of distinct powers of $x_{[K-1]}$ associated with that term, and so on down the tree. The number of leaves in the tree equals the number of terms in the polynomial $h_{j,l}(x_{[1]}, \ldots, x_{[K]})$. The maximum number of leaves below any of the lowest level nodes (across all (j,l) pairs) tells us the weight of the code (weight-I, weight-II, etc.). The edge labels indicate the exponents that define the non-zero polynomials.

We can also define a fine-grained "weight at level k" of a hierarchical code by the maximum number of leaves below any of the nodes at level k. A hierarchical code can have different weights at different levels; for example, the code from Example 2 with tree structure shown in FIG. 4 is weight-II at level 1 (the lowest level), weight-III at level 2, and weight-II at level 3.

Any HQC LDPC code can be defined in terms of its polynomial parity check matrix, as defined in Definition 1, or equivalently in terms of its tree structure, as defined in Definition 3.

Cycles in Hierarchical QC LDPC Codes

In order to be able to construct a high-girth HQC LDPC code, we need to be able to identify whether it has cycles of a particular length in its Tanner graph by examining its polynomial parity check matrix. The following are necessary and sufficient conditions on the polynomial parity check matrix of an HQC LDPC code for that code to have a cycle of a particular length. Compared to cycles in standard QC LDPC codes, the cycles in HQC LDPC codes need to be cycles at all levels of the hierarchy simultaneously, according to the following definitions and theorems.

Definition 4:

A length-$2\Lambda$ path P through a K-variate $J_{[K]} \times L_{[K]}$ polynomial parity check matrix $H(\bullet)$ of an HQC LDPC code is specified by two sets, O and S, i.e., $P=\{O,S\}$.

The first set O is an ordered series $$O=\{(j_1,l_1),(j_2,l_2),(j_3,l_3),L,(j_{2\Lambda},l_{2\Lambda})\} \quad (29)$$

such that $1 \leq j_t \leq J_{[K]}$ and $1 \leq l_t \leq L_{[K]}$ for all $t, 1 \leq t \leq 2\Lambda$, $j_{2\Lambda}=j_1$, $j_t=j_{t+1}$ for $t \in Z_{even}$ (even integers), $l_t=l_{t+1}$ for $t \in Z_{odd}$ (odd integers), $|C[j,l]|>0$ for all $(j,l) \in O$, where the set $C[j,l]$ is defined to be the set of coefficients in the polynomial in the jth row and lth column of $H(\bullet)$ that are non-zero:

$$C[j,l]=\{c_{s_1,\ldots,s_K}[j,l]:c_{s_1,\ldots,s_K}[j,l] \neq 0\}. \quad (30)$$

The second set S is a set of length-K vectors of coefficient indices $$S=\{s[j_1,l_1],s[j_2,l_2],K,s[j_{2\Lambda},l_{2\Lambda}]\} \quad (31)$$

where, as implied by the notation, $(j_t,l_t) \in O$ for all $t, 1 \leq t \leq 2\Lambda$, and $|S|=|O|$.

Furthermore,

The kth coordinate $s_k[j,l]$ of $s[j,l]$ satisfies $0 \leq s_k[j,l] \leq p_{[k]}-1$ or all $(j,l) \in O$, $c_{s[j,l]}[j,l] \in C[j,l]$ for all $(j,l) \in O$, where $c_{s[j,l]}[j,l]$ is a compact notation for $c_{s_1,\ldots,s_K}[j,l]$.

If consecutive elements of O are identical, $(j_t,l_t)=(j_{t+1},l_{t+1})$ for some $t, 1 \leq t \leq 2\Lambda$, then $s[j_t,l_t] \neq s[j_{t+1},l_{t+1}]$.

Theorem 1:

A path length-$2\Lambda$ path $P=\{O, S\}$ through the K-variate $J_{[K]} \times L_{[K]}$ polynomial parity check matrix $H(\bullet)$ corresponds to length-$2\Lambda$ cycles in the Tanner graph if and only if, for every k, $1 \leq k \leq K$, $$\Sigma[k] \bmod p_{[k]}=0. \quad (32)$$

where the alternating sums, $\Sigma[k]$ for each k, $1 \leq k \leq K$ are defined by $$\Sigma[k] = \sum_{t=1}^{2\Lambda} (-1)^t s_k[j_t, l_t]. \quad (33)$$

Theorem 2:

A necessary and sufficient condition for a K-level hierarchical QC LDPC code to have girth at least $2(\Lambda+1)$ is the following. For all paths through the polynomial parity check matrix of length at most $2\Lambda$ (path length at least four and at most $2\Lambda$), condition (32) does not hold for at least one k, $1 \leq k \leq K$.

Consider again as an example the polynomial parity check matrices H(x) and H(x,y), respectively specified in (20) and (21). First consider the non-hierarchical description of the code specified by H(x). A cycle of length-four exists traversing the path $P=\{O,S\}$ where $O=\{(0,0),(1,0),(1,5),(0,5)\}$.

This corresponds to, in order, the four polynomials $x^2=C_2[0,0]x^2$, $x+x^7=c_1[1,0]X+c_7[1,0]x^7$, $x^7=c_7[1,5]x^7$, $1+x^6=c_0[0,5]x^0+c_6[0,5]x^6$.

Selection $c_2[0,0]$, $c_1[1,0]$, $c_7[1,0]$ and $c_0[0,5]$ results in $S=\{2,1,7,0\}$.

We calculate the sum to be $$\Sigma[1] \bmod 8=(-2+1-7+0) \bmod 8=0, \quad (34)$$

where $p_{[1]}$ for this code. This example confirms, in the general notation, the test for cycles in non-hierarchical QC LDPC codes.

Consider the same cycle from the hierarchical perspective. With respect to the two-level representation H(x,y) of equation (21) the same cycle through the Tanner graph corresponds to the ordered series $O=\{(0,0),(0,0),(0,1),(0,1)\}$.

Now we have polynomials $x^2+(x+x^7)y^2$ and $x^7y+(1+x^6)y^2$ which, respectively, are $c_{2,0}[0,0]x^2+c_{1,2}[0,0]xy^2+c_{7,2}[0,0]x^7y^2$, and $c_{7,1}[0,1]x^2+c_{0,2}[0,1]xy^2+c_{6,2}[0,1]x^7y^2$.

The same cycles correspond to the coefficient indices $$S = \left\{ \begin{bmatrix} 2 \\ 0 \end{bmatrix}, \begin{bmatrix} 1 \\ 2 \end{bmatrix}, \begin{bmatrix} 7 \\ 1 \end{bmatrix}, \begin{bmatrix} 0 \\ 2 \end{bmatrix} \right\}.$$

Note that the first sub-index of each coefficient corresponds to the sub-index of the coefficients selected at the one-level view. The alternating sums along the path are $\Sigma[1] \bmod 8=(-2+1-7+0) \bmod 8=0$ $\Sigma[2] \bmod 3=(-0+2-1+2) \bmod 3=0$ where $p_{[1]}=8$ and $P_{[2]}=3$ for this code.

HQC LDPC codes are a generalization of QC LDPC codes, and they also can have inevitable cycles. In particular, there will inevitably be cycles of length six for any HQC LDPC code if any labeled tree in the tree matrix defining the code has three leaves. There will inevitably be eight-cycles if, in any row or in any column of the matrix of labeled trees defining the HQC LDPC code, there is a pair of labeled trees both having two leaves.

Restricted Two-Level HQC LDPC Codes

Figure 8:
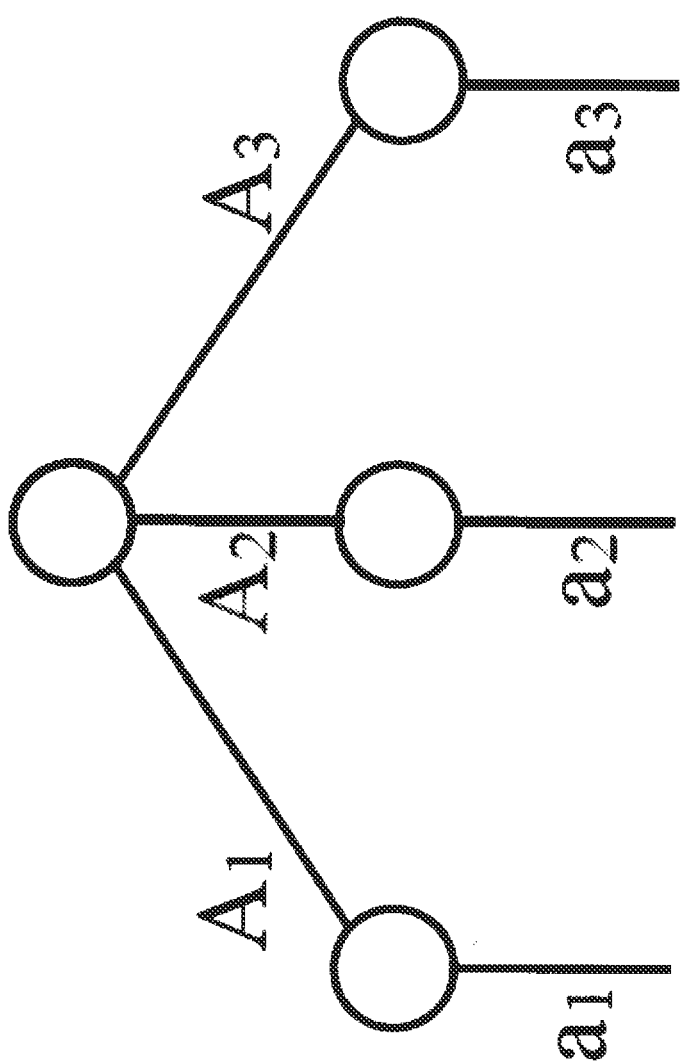
FIG. 8 is an example of an element of a tree matrix representing a restricted two-level hierarchical QC LDPC code.

One embodiment of our method uses HQC LDPC codes which we call "restricted two-level" HQC LDPC codes. As "restricted two-level" implies, the hierarchy in restricted two-level HQC LDPC codes has only two levels. The additional "restriction" is that the weight of the first (lowest) level is one. In terms of the tree structure description of these codes, the labeled trees all have a form as shown in FIG. 8, with the nodes at the bottom level each having exactly one leaf, i.e., leafs have no siblings. Nodes at the second level can have an arbitrary number of edges.

The fact that restricted two-level codes have two levels means that they are described by a polynomial parity check matrix in two dummy variables H(x,y). The restriction to the lowest level having weight one means that any weight-w polynomial in the matrix H(x,y) must have the form $$x^{a_1} y^{A_1} + x^{a_2} y^{A_2} + \ldots + x^{a_w} y^{A_w} \qquad (35)$$

where all the $A_i$ exponents must be distinct. As usual, the exponents are integers which range between 0 and $P_{[1]}-1$ for the x exponents and 0 and $P_{[2]}-1$ for the y exponents.

As previously described, a "direct transformation" converts a protograph into a standard QC LDPC code by replacing the connectivity matrix equivalent to the protograph with a polynomial parity check matrix H(x) whose polynomial entries had weight equal to the entries in the connectivity matrix. A similar direct transformation exists for converting protographs into restricted two-level HQC LDPC codes. One replaces the connectivity matrix with a bi-variate polynomial parity check matrix H(x,y) whose polynomial entries each have the restricted form of equation (35) and with weight equal to the entries in the connectivity matrix.

For example, the connectivity matrix corresponding to the protograph 600 shown in FIG. 6 is $$C = \begin{bmatrix} 1 & 1 & 1 \\ 0 & 1 & 2 \end{bmatrix}. \qquad (36)$$

This matrix is directly transformed into a two-level restricted HQC LDPC code with polynomial parity check matrix $$H(x, y) = \begin{bmatrix} x^a y^A & x^b y^B & x^c y^C \\ 0 & x^d y^D & x^e y^E + x^f y^F \end{bmatrix}, \qquad (37)$$

where a, b d, e, and f are integer exponents between 0 and $p_{[1]}-1$ and A, B, C, D, E, and F are integer exponents between 0 and $p_{[2]}-1$ that satisfy E≠F.

Code Design Pipeline

Figure 9:
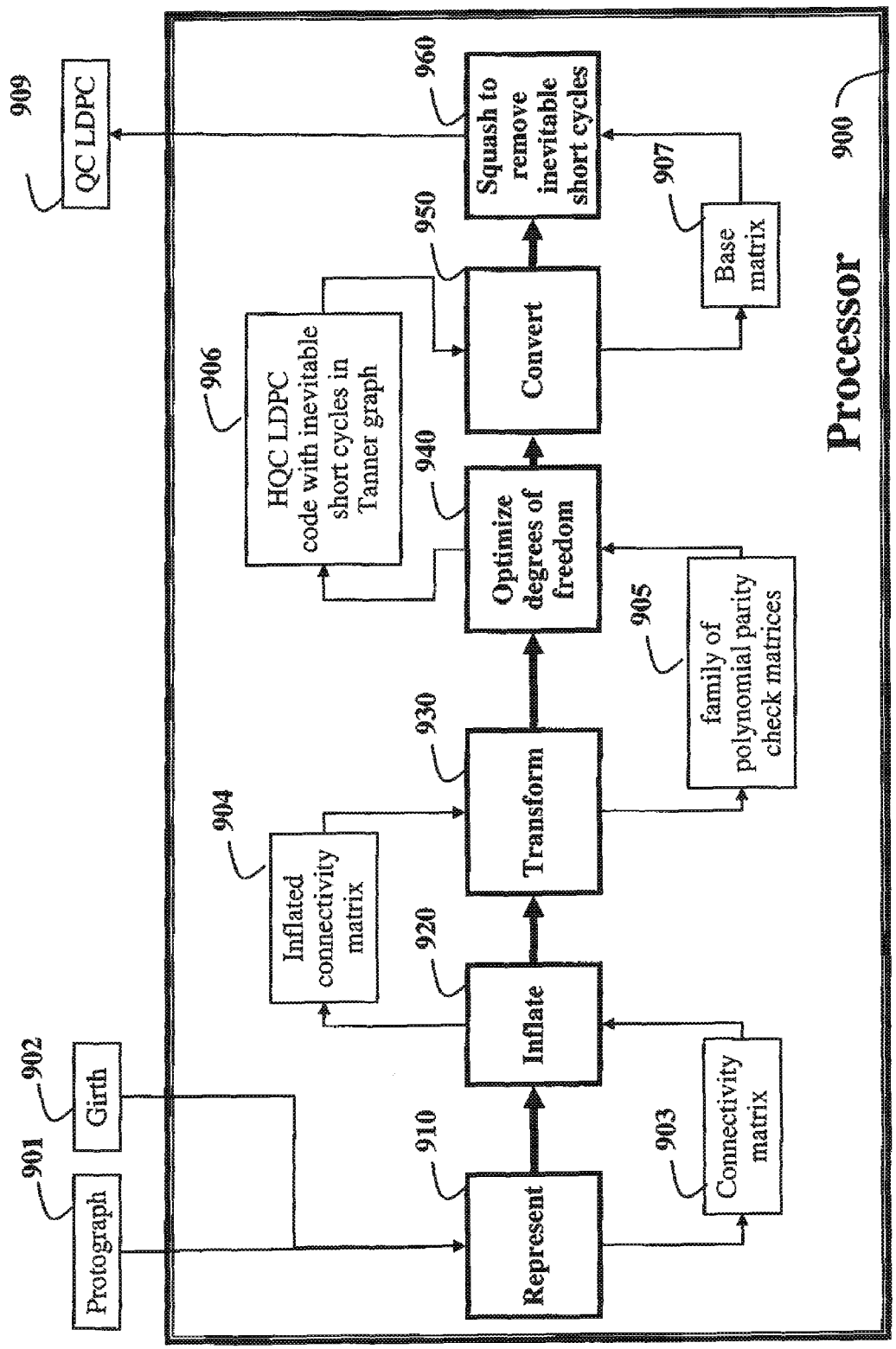
FIG. 9 is a block diagram of a method for constructing high-girth QC LDPC codes according one embodiment of the invention.

FIG. 9 shows a block diagram of a method for constructing high-girth QC LDPC codes according to one embodiment of the invention. The embodiment is described as follows. A predetermined protograph 901 and a predetermined girth 902 are inputs to the method. The protograph 901 is represented 910 as a connectivity matrix 903. Depending on the weight and relative locations of the entries in the connectivity matrix, the embodiment inflates 920 the connectivity matrix to obtain an inflated connectivity matrix 904. Next, the inflated connectivity matrix is directly transformed 930 into a family of polynomial parity check matrices for restricted two-level HQC LDPC codes 905. In this embodiment, we use a value for the parameter $P_{[2]}$ of four. Next, using a girth-maximization procedure (described in more detail below) to optimize the remaining degrees of freedom 940, the embodiment eliminates all non-inevitable six- and eight-cycles and obtains an HQC LDPC code that only has inevitable short cycles in corresponding Tanner graph 906. The embodiment converts 950 the polynomial parity check matrix of that HQC LDPC code into an equivalent base matrix 907. Finally, a "squashing procedure" 960 is used to eliminate inevitable cycles and obtain our desired high-girth QC LDPC code 909.

The embodiment inflates the code in a manner compatible with the squashing to produce a valid parity check matrix that meets the parameters of interest. The LDPC code resulting from this procedure will be a QC LDPC and not an HQC LDPC code, although the final structure is similar to that of the HQC LDPC code.

As indicated, the procedure first produces the connectivity matrix C of the protograph. For the purposes of an example, assume that the protograph 210 is that shown in FIG. 2A. The "inflation" procedure works as follows. We first mark for duplication each row of the matrix with two or more elements of value 2 or greater or a single element of value 3. We also mark each column that has two or more elements of value 2 or greater. Then, we inflate C to produce a new connectivity matrix C' in which each of the rows in C marked for duplication is duplicated. We then inflate again to produce C" from C' by duplicating each of the marked columns. As will be evident when we get to squashing, we must track in the matrices C' and C" which rows and columns are duplicated versions of each other.

In our example, the connectivity matrix 205

$$C = \begin{bmatrix} 3 & 2 & 1 \\ 0 & 2 & 1 \end{bmatrix}. \qquad (38)$$

The first row 212 in this connectivity matrix contains an element with value 3 (and also two elements of value 2 or greater), so we mark it, and we also mark the second column 214 because it has two elements with value 2 or greater. Duplicating the first row, we obtain 220

$$C' = \begin{bmatrix} 3 & 2 & 1 \\ 3 & 2 & 1 \\ 0 & 2 & 1 \end{bmatrix}. \qquad (39)$$

Now duplicating the second column, we obtain the inflated connectivity matrix 230

$$C'' = \begin{bmatrix} 3 & 2 & 2 & 1 \\ 3 & 2 & 2 & 1 \\ 0 & 2 & 2 & 1 \end{bmatrix}. \qquad (40)$$

In C", the first and second rows, and also the second and third columns, are tracked as duplicated versions of each other. This is noted by the lines of duplication 216 and 225.

Next, we make a direct transformation of the inflated connectivity matrix 230 C" into the polynomial parity check matrix 240 (x,y) representing a family of two-level restricted HQC LDPC codes with $P_{[2]}=4$. We perform this transformation under one additional restriction. The restriction is that the y exponents in pairs of duplicated rows or pairs of duplicated columns must be identical to each other. The value of $p_{[1]}$ is left as a design parameter.

In our example, the inflated connectivity matrix 230 C" is directly transformed into a polynomial parity check matrix 240, H" (x,y) yielding the form $$H''(x, y) = \qquad (41)$$

$$\begin{bmatrix} x^a y^A + x^b y^B + x^c y^C & x^d y^D + x^e y^E & x^f y^D + x^g y^E & x^h y^H \\ x^i y^A + x^j y^B + x^k y^C & x^l y^D + x^m y^E & x^n y^D + x^o y^E & x^p y^H \\ 0 & x^q y^Q + x^r y^R & x^s y^Q + x^t y^R & x^u y^U \end{bmatrix}.$$

Notice that the y exponents in the first and second rows and in the second and third columns (the rows and columns across a line of duplication) of this matrix have been restricted to be identical to each other. Otherwise, all the exponents are free parameters that satisfy $0 \leq a_i \leq p_{[1]}-1$ or any x exponent $a_i$ and $0 \leq A_i \leq p_{[2]}1=3$ for any y exponent $A_i$.

In the next step, we apply the girth-maximization procedure (described in more detail below) to optimize 940 the degrees of freedom and produce a set of x-exponents $a_i$ and y-exponents $A_i$ such that no short cycles exist except those that are inevitable. For example, we find, using our girth-maximization procedure with $p_{[1]}=200$, that the following choices 250 for the x and y exponents in H"(x,y) does not generate six-cycles or eight-cycles except for inevitable short cycles:

$$\begin{bmatrix} x^{128}y^1 + x^{69}y^2 + x^{118}y^3 & x^{11}y^2 + x^{121}y^3 & x^{170}y^2 + x^{109}y^3 & x^{38}y^3 \\ x^{63}y^1 + x^{156}y^2 + x^{38}y^3 & x^{186}y^2 + x^{183}y^3 & x^{52}y^2 + x^{146}y^3 & x^{43}y^3 \\ 0 & x^{100}y^0 + x^{104}y^1 & x^{187}y^0 + x^{50}y^1 & x^{59}y^1 \end{bmatrix} \quad (42)$$

The code with the above polynomial parity check matrix is equivalent to a weight-I QC LDPC code with base matrix B" 265 given by $$\begin{bmatrix} -1 & 128 & 69 & 118 & -1 & -1 & 11 & 121 & -1 & -1 & 170 & 109 & -1 & -1 & -1 & 38 \\ 118 & -1 & 128 & 69 & 121 & -1 & -1 & 11 & 109 & -1 & -1 & 170 & 38 & -1 & -1 & -1 \\ 69 & 118 & -1 & 128 & 11 & 121 & -1 & -1 & 170 & 109 & -1 & -1 & -1 & 38 & -1 & -1 \\ 128 & 69 & 118 & -1 & -1 & 11 & 121 & -1 & -1 & 170 & 109 & -1 & -1 & -1 & 38 & -1 \\ -1 & 63 & 156 & 38 & -1 & -1 & 186 & 183 & -1 & -1 & 52 & 146 & -1 & -1 & -1 & 43 \\ 38 & -1 & 63 & 156 & 183 & -1 & -1 & 186 & 146 & -1 & -1 & 52 & 43 & -1 & -1 & -1 \\ 156 & 38 & -1 & 63 & 186 & 183 & -1 & -1 & 52 & 146 & -1 & -1 & -1 & 43 & -1 & -1 \\ 63 & 156 & 38 & -1 & -1 & 186 & 183 & -1 & -1 & 52 & 146 & -1 & -1 & -1 & 43 & -1 \\ -1 & -1 & -1 & -1 & 100 & 104 & -1 & -1 & 187 & 50 & -1 & -1 & -1 & 59 & -1 & -1 \\ -1 & -1 & -1 & -1 & -1 & 100 & 104 & -1 & -1 & 187 & 50 & -1 & -1 & -1 & 59 & -1 \\ -1 & -1 & -1 & -1 & -1 & -1 & 100 & 104 & -1 & -1 & 187 & 50 & -1 & -1 & -1 & 59 \\ -1 & -1 & -1 & -1 & 104 & -1 & -1 & 100 & 50 & -1 & -1 & 187 & 59 & -1 & -1 & -1 \end{bmatrix} \quad (43)$$

The base matrix B" is composed of 4 by 4 circulant sub-matrices.

We now have a base matrix B" corresponding to the inflated connectivity matrix C". The next steps in our procedure remove columns and rows from B" to obtain a base matrix corresponding to our original connectivity matrix C.

First, each column of the connectivity matrix C" corresponds to four columns in the base matrix B". In the next step of our procedure, we focus on the columns that have been marked as duplicates in C". We retain the left two columns and remove the right two columns in B" from the four that correspond to the left column of a duplicated pair in C", and also remove the left two columns but retain the right two columns in B" from the four that correspond to the right column of a duplicated pair in C"

In our example, the second and third columns of C" 230 are marked as duplicates, so we remove the four columns 265 from B" 260 to obtain the thinned-out matrix 270 B'.

At this stage, each row in the connectivity matrix C' corresponds to four rows in the base matrix B'. We now focus on the rows that have been marked as duplicates in C'. We retain the top two rows in B' from the four that correspond to the top row in a duplicated pair in C', and we retain the bottom two rows in B' from the four that correspond to the bottom row of a duplicated pair in C'. We call the base matrix obtained by this further thinning-out procedure B; this is the base matrix that will correspond to our original connectivity matrix C.

In our example, the first and second rows of C' 220 have been marked as duplicates. That means that we should remove the top four rows 275 from the matrix 270, to obtain the final base matrix 280. Thus, we finally obtain $$B = \begin{bmatrix} -1 & 128 & 69 & 118 & -1 & -1 & 170 & 109 & -1 & -1 & -1 & 38 \\ 118 & -1 & 128 & 69 & 121 & -1 & -1 & 170 & 38 & -1 & -1 & -1 \\ 156 & 38 & -1 & 63 & 186 & 183 & -1 & -1 & -1 & 43 & -1 & -1 \\ 63 & 156 & 38 & -1 & -1 & 186 & 146 & -1 & -1 & -1 & 43 & -1 \\ -1 & -1 & -1 & -1 & 100 & 104 & -1 & -1 & -1 & 59 & -1 & -1 \\ -1 & -1 & -1 & -1 & -1 & 100 & 50 & -1 & -1 & -1 & 59 & -1 \\ -1 & -1 & -1 & -1 & -1 & -1 & 187 & 50 & -1 & -1 & -1 & 59 \\ -1 & -1 & -1 & -1 & 104 & -1 & -1 & 187 & 59 & -1 & -1 & -1 \end{bmatrix} \quad (44)$$

The code defined by the final base matrix B is not a hierarchical QC LDPC code, because that base matrix is constructed from 4 by 4 sub-matrices that are not circulant. Still, the code is a member of the class defined by the original protograph. In our example, each group of four rows and four columns in the base matrix defines a type of check or bit. So in our example, from the structure of B, each check of the first type will be connected to three bits of the first type, and two bits of the second type, and so on, just as required by the protograph.

Furthermore, our inflation and squashing procedure removes all "inevitable" six-cycles and eight-cycles from the code, because all such inevitable cycles use three rows or three columns within the relevant four by four sub-matrices, and we have removed two rows or columns from each such sub-matrix. Thus, assuming the girth-maximization procedure removes all other six-cycles and eight-cycles, the obtained QC LDPC code will have girth of at least ten.

Girth Maximization Procedure

In one variation of the embodiment, the degrees of freedom 940 in the family of polynomial parity check matrices 905 are optimized using hill-climbing girth maximization to produce an HQC LDPC code whose only short cycles in its Tanner graph are "inevitable" short cycles 906.

Figure 10:
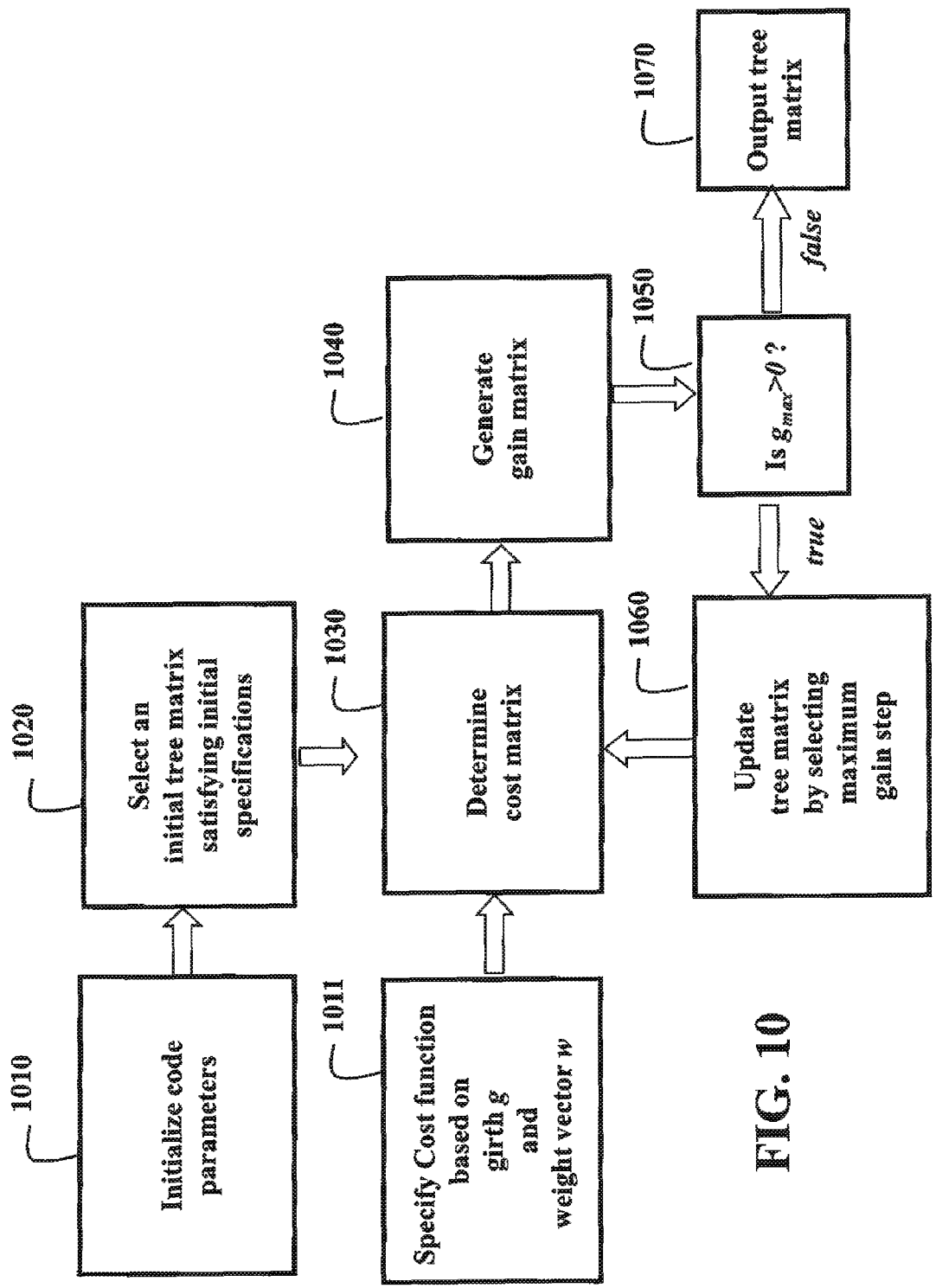
FIG. 10 is a block diagram of the hill-climbing girth maximization according to one embodiment.

FIG. 10 shows a block diagram of the hill-climbing girth maximization according to one embodiment. The input to the girth maximization is a matrix of unlabeled trees $T_{i,j}$ that specify a family of HQC LDPC codes. The output is a value for each edge of each tree. We initialize 1010 the procedure with a code randomly selected from the codes that have the desired tree structure. This means that we randomly assign labels to the trees T subject to the constraints that sibling edges must have distinct labels.

Another input to the procedure is a "cost function" 1011 associated with each type of cycle. The cost function used depends on the number of cycles in the current code that have length less than the desired girth. A weight vector is used such that shorter cycles are weighted to be more costly than longer cycles. For example, if girth 10 is desired, we assign a cost of 100 for each four-cycle, a cost of 10 for each six-cycle, and a cost of 1 for each eight-cycle. Because the method minimizes cost, the method first removes four-cycles, then six-cycles, and finally eight-cycles.

The girth maximization method iteratively updates a sequence of edge labels. At each iteration, the method changes the single edge label to the value that effects the greatest reduction in the cost function. For example, a "cost matrix" is determined 1030 which, for each edge, describes the cost of changing that label to every other possible label. From the cost matrix, a "gain matrix" can be generated 1040 which gives the improvement in cost for changing each possible edge to each possible label.

The method terminates when the method can no longer change any single coefficient to a value that further reduces the cost (and thus the number of undesired cycles). Formally, this means that the maximum gain in the gain matrix is no longer positive 1050. At that point, we output 1070 the current tree matrix representing the HQC LDPC code. If there is a positive gain, which means the cost can be improved, the edge label change that most improves the cost is used to update the tree matrix 1060 appropriately. Then we re-determine the cost matrix 1030 and iterate.

Updates are performed subject to the sibling constraint on edge labels. This preserves the tree structure of the code and thus, the protograph structure of the code is an invariant under the updates. A change in a single edge label can have a trickle-down effect on a number of code coefficients (equal to the number of leaves in the tree that are descendent of that edge).

Figure 11:
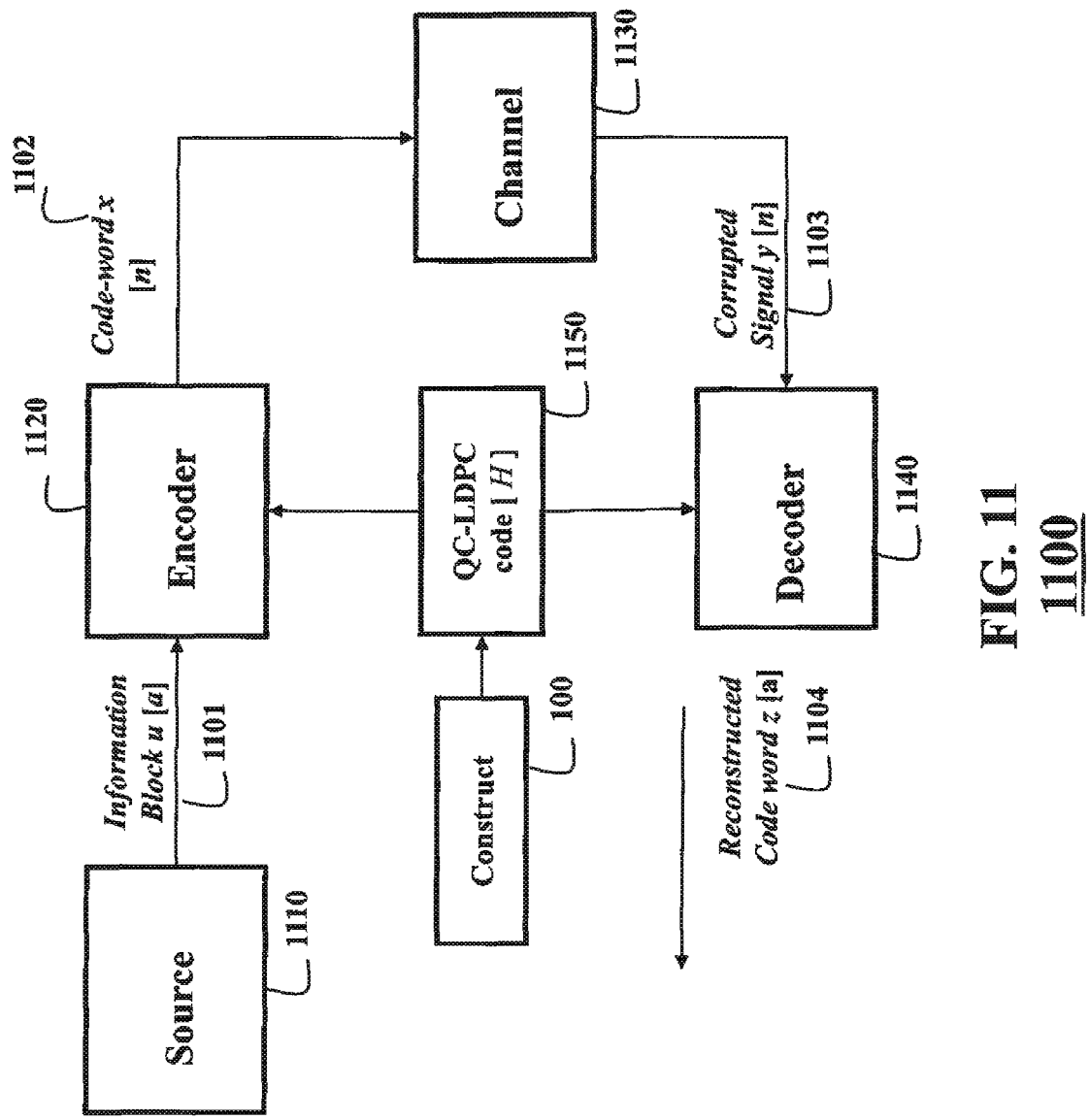
FIG. 11 is a schematic of various systems employing some embodiments of the invention.

The QC LDPC code determined by embodiments of the invention can be used in both decoding and encoding procedures, such as by a system 1100 shown in FIG. 11. The embodiments of the invention provide the method 100 for constructing a quasi-cyclic low-density parity-check (QC-LDPC) code with a high girth, which can be stored in a memory 1150. Such a code can then be used by an encoder 1120 to encode data, e.g., an information block 1101 of k symbols u[a] generated by a source 1110. The encoded data can be transmitted through a noisy channel 1130 as a codeword x[n] 1102 including N symbols. The channel can be a communications channel. The "channel" can also be storage media. In this case, the code-word is written to the media for later retrieval.

It is possible for the channel to corrupt the code-word to a signal y[n] 1103. The signal is then passed to a decoder 1140, which attempts to output a reconstruction z[a] 1104 of the information block u[a] 1101 using the QC-LDPC code 1150.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Further, it should be appreciated that a computer may be embodied in any of a number of forms, such as a rack-mounted computer, a desktop computer, a laptop computer, minicomputer, or a tablet computer. Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The invention has been described by way of examples of preferred embodiments. It is to be understood that various other adaptations and modifications may be made within the spirit and scope of the invention. Therefore, it is the object of the appended claims to cover all such variations and modifications as come within the true spirit and scope of the invention.

We claim:

1. A method for encoding data using an encoder comprises: determining a quasi-cyclic (QC) low-density parity-check (LDPC) code corresponding to a protograph represented by a connectivity matrix, such that
    duplicating at least several elements of the connectivity matrix along at least one line of duplication to produce an inflated connectivity matrix, wherein values of the at least several elements in the connectivity matrix form a pattern indicated by the predetermined girth;
    determining a hierarchical quasi-cyclic (HQC) LDPC code corresponding to the inflated connectivity matrix, where in the HQC LDPC code is represent by a matrix of circulant sub-matrices; and
    removing the at least several elements of the matrix representing the HQC LDPC code, such that the matrix is squashed along the line of duplication to produce the QC LDPC code, wherein the steps of the method are performed by a processor.

2. The method of claim 1, wherein the predetermined girth is ten or greater.

3. The method of claim 1, wherein the protograph represents a spatially-coupled code.

4. The method of claim 1, wherein the pattern includes a row or a column of the connectivity matrix having at least two elements with values greater than two or at least one element with a value greater than three.

5. The method of claim 1, wherein the HQC LDPC code is a restricted two-level HQC LDPC code.

6. The method of claim 1, wherein the determining further comprises:
    transforming the inflated connectivity matrix into a family of hierarchical quasi-cyclic (HQC) LDPC codes; and
    selecting at least one HQC LDPC code from the family of HQC LDPC codes such that the girth of the HQC LDPC code is optimized.

7. The method of claim 6, wherein the selecting uses a hill-climbing procedure.

8. The method of claim 7, wherein the hill-climbing procedure further comprises:
    selecting a tree structure for each HQC LDPC code in the family;
    determining a cost for each tree structure;
    changing repeatedly a single edge label in the tree structure to maximize a reduction in the cost; and
    constructing the polynomial parity check matrix for HQC LDPC code from the tree structure when the cost is at a minimum.

9. The method of claim 6, wherein the transforming is a direct transformation of the connectivity matrix into the family of restricted two-level HQC LDPC codes.

10. The method of claim 6, wherein the transforming comprises:
    transforming the inflated connectivity matrix into a family of polynomial parity check matrices describing a corresponding family of HQC LDPC codes, wherein an element of a polynomial parity check matrix includes a polynomial in first variable x and a second variable y, and wherein exponents of the second variable y on both sides of the line of duplication are equal.

11. The method of claim 10, wherein the selecting comprises:
    optimizing degrees of freedom in the family of polynomial parity check matrices to obtain the HQC LDPC code; and
    converting the polynomial parity check matrix of the HQC LDPC into a base matrix code to produce the matrix of the HQC LDPC code.

12. The method of claim 11, wherein the squashing procedure removes two columns in the base matrix code from each set of four columns corresponding to each duplicated column in the inflated connectivity matrix, and further removes two rows in the base matrix from each set of four rows corresponding to each duplicated row in the inflated connectivity matrix.

13. The method of claim 1, wherein the HQC LDPC code is represented by a polynomial parity check matrix and the matrix of the HQC LDPC code is a base matrix representing the code, further comprising:
    converting the polynomial parity check matrix into the base matrix code to produce the matrix.

14. The method of claim 13, wherein the base matrix code is constructed using four-by-four sub-matrices.

15. The method of claim 1, wherein the line of duplication extends between rows or columns of the connectivity matrix, the element of the inflated connectivity matrix corresponds to N elements of the matrix, wherein the removing further comprises:
    removing all but two elements from the matrix on both sides of the line of duplication.

16. The method of claim 1, wherein N equals four, such that the removing includes removing two elements from the matrix on both sides of the line of duplication.

17. The method of claim 1, wherein the HQC LDPC code includes K levels and is defined by a multi-variate polynomial parity check matrix in K variables.

18. The method of claim 1, wherein each sub-matrix of the matrix has a circulant structure, wherein values of the elements of the sub-matrix change the circulant flow over a transitional line.

19. The method of claim 1, further comprising:
    encoding data using the HQC LDPC code to produce an encoded data; and
    transmitting the encoded data over a channel.

* * * * *